(12) United States Patent
Barbato

(10) Patent No.: US 10,713,113 B2
(45) Date of Patent: Jul. 14, 2020

(54) SOLID STATE DRIVE IMPLEMENTING POLAR ENCODING AND SUCCESSIVE CANCELLATION LIST DECODING

(71) Applicant: Sabrina Barbato, Turate (IT)

(72) Inventor: Sabrina Barbato, Turate (IT)

( * ) Notice: Subject to any disclaimer, the term of this patent is extended or adjusted under 35 U.S.C. 154(b) by 20 days.

(21) Appl. No.: 16/124,034

(22) Filed: Sep. 6, 2018

(65) Prior Publication Data

US 2020/0081768 A1    Mar. 12, 2020

(51) Int. Cl.
  *G06F 11/10* (2006.01)
  *H04L 1/00* (2006.01)
  *H03M 13/13* (2006.01)

(52) U.S. Cl.
  CPC ......... *G06F 11/1008* (2013.01); *H03M 13/13* (2013.01); *H04L 1/0045* (2013.01)

(58) Field of Classification Search
  CPC ... G06F 11/1008; H04L 1/0045; H03M 13/13
  See application file for complete search history.

(56) References Cited

U.S. PATENT DOCUMENTS

| | | | | |
|---|---|---|---|---|
| 9,819,361 B2* | 11/2017 | Shin | ..................... | H03M 13/134 |
| 10,193,578 B2* | 1/2019 | Gross | ..................... | H03M 13/09 |
| 2014/0019820 A1* | 1/2014 | Vardy | ..................... | H03M 13/13 |
| | | | | 714/752 |
| 2018/0287738 A1* | 10/2018 | Xu | ..................... | H04L 1/0041 |
| 2018/0323809 A1* | 11/2018 | Lin | ..................... | H04L 1/0053 |
| 2018/0323810 A1* | 11/2018 | Sarkis | ............... | H04W 72/0406 |

OTHER PUBLICATIONS

A. Balatsoukas-Stimming, M. B. Parizi and A. Burg, "LLR-Based Successive Cancellation List Decoding of Polar Codes," in IEEE Transactions on Signal Processing, vol. 63, No. 19, pp. 5165-5179, Oct. 1, 2015. (Year: 2015).*
H. Saber, Y. Ge, R. Zhang, W. Shi and W. Tong, "Convolutional Polar Codes: LLR-based Successive Cancellation Decoder and List Decoding Performance," 2018 IEEE International Symposium on Information Theory (ISIT), Vail, CO, 2018, pp. 1480-1484. (Year: 2018).*

(Continued)

*Primary Examiner* — Cynthia Britt
(74) *Attorney, Agent, or Firm* — Janeway Patent Law, PLLC; John M. Janeway

(57) ABSTRACT

A method is proposed for operating a solid state storage device. The method comprises: encoding information and frozen bits into polar encoded bits; storing the polar encoded bits; reading the polar encoded bits, wherein the read polar encoded bits include the frozen bits and unfrozen bits, and performing a SCL decoding. The SCL decoding comprises: providing a list of candidate decoding paths; duplicating the candidate decoding paths; determining a maximum list size indicative of an allowed maximum number of candidate decoding paths that can be contained in the list of candidate decoding paths; pruning at least one duplicated candidate decoding path according to the maximum list size, and including in the list of candidate decoding paths a number of non-pruned duplicated candidate decoding paths not higher than the maximum list size; and selecting a decoding path from the list of candidate decoding paths.

35 Claims, 11 Drawing Sheets

(56) References Cited

OTHER PUBLICATIONS

B. Yuan and K. K. Parhi, "Successive cancellation list polar decoder using log-likelihood ratios," 2014 48th Asilomar Conference on Signals, Systems and Computers, Pacific Grove, CA, 2014, pp. 548-552. (Year: 2014).*

A. Balatsoukas-Stimming, M. Bastani Parizi and A. Burg, "LLR-based successive cancellation list decoding of polar codes," 2014 IEEE International Conference on Acoustics, Speech and Signal Processing (ICASSP), Florence, 2014, pp. 3903-3907. (Year: 2014).*

B. Yuan and K. K. Parhi, "LLR-Based Successive-Cancellation List Decoder for Polar Codes With Multibit Decision," in IEEE Transactions on Circuits and Systems II: Express Briefs, vol. 64, No. 1, pp. 21-25, Jan. 2017. (Year: 2017).*

* cited by examiner

SOLID STATE DRIVE IMPLEMENTING POLAR ENCODING AND SUCCESSIVE CANCELLATION LIST DECODING

BACKGROUND OF THE INVENTION

Field of the Invention

The present invention generally relates to solid state storage devices (hereinafter, "Solid State Drives" or SSD devices), such as SSD devices based on non-volatile memory cells (e.g., NAND flash memory cells) for storing data. More particularly, the present invention relates to SSD devices provided with error correction capabilities. Even more particularly, the present invention relates to SSD devices (or controllers thereof) implementing polar encoding and successive cancellation list decoding.

Overview of the Related Art

Nowadays, the ever-developing digital technologies allow achieving extremely high communication speeds. However, traditional hard disk drives (HDD) can no longer meet the throughput and latency requirements of most state-of-the-art application scenarios. To this end, SSD devices, which feature low access time, high compactness, and low noise, have become increasingly popular for storage market.

SSD devices are mainly based on NAND flash memory cells. As the required storage density increases, most SSD devices consider to store more than two bits in a single memory cell; the more bits are stored in a single memory cell, the worse raw error performance. Therefore, powerful forward-error correction (FEC) methods are required, and voluminous researches on conventional error correction code (ECC) schemes for SSD devices emerge.

Recently, low-density parity-check (LDPC) codes have been considered. To balance performance and complexity, hybrid scheme combining hard decoding and soft decoding is typically employed. However, typical soft decoding, such as soft decoding based on min-sum and belief-propagation, still suffer from high complexity.

More recently, polar codes have shown capacity-achieving performance and reasonable complexity (see E. Arikan, "*Channel polarization: A method for constructing capacity-achieving codes for symmetric binary-input memoryless channels*", IEEE Trans. Inf Theory, 2009, vol. 55, no. 7, pp. 3051-3073; C. Zhang, B. Yuan, K. K. Parhi, "*Reduced-latency sc polar decoder architectures*", Proceedings of IEEE International Conference on Communications (ICC), 2012, pp. 3471-3475; and C. Zhang, K. K. Parhi, "*Low-latency sequential and overlapped architectures for successive cancellation polar decoder*", IEEE Trans. Signal Process., 2013, vol. 61, no. 10, pp. 2429-2441).

Besides its good performance over binary-input discrete memoryless channels (B-DMCs), polar code encoding and decoding complexity is much lower than that of LDPC code.

SUMMARY OF THE INVENTION

The Applicant has recognized that SSD devices based on polar encoding and decoding are not satisfactory for modern technological requirements.

According to the Applicant, this is substantially due to the fact that decoding polar encoded bits may imply excessive hardware and software complexity of the SSD device.

Considering in particular decoding of polar encoded bits based on successive cancellation list decoding, successive cancellation list decoding allows at most a fixed number of candidate decoding paths to be explored at each decoding level: at each decoding level, the candidate decoding paths are included (i.e., stored) in a list of candidate decoding paths (the list of candidate decoding path having a size, hereinafter list size, which is fixed). At each decoding level, successive cancellation list decoding duplicates the number of candidates decoding paths (thereby obtaining corresponding duplicated candidate decoding paths), prunes one or more of the duplicated candidate decoding paths, and updates the list of candidate decoding paths by including the non-pruned duplicated candidate decoding paths in the list of candidate decoding paths for iterating duplication, pruning and updating operations at the next decoding level.

The Applicant has understood that the performance of the conventional successive cancellation list decoding increases as the list size increases, but that a list size increase adds hardware and software complexity to the SSD device (so that list sizes bigger than 32 seem impractical for long codes).

The Applicant has tackled the above-discussed issues, and has devised a method for operating a SSD device (and a corresponding SSD device) based on an improved successive cancellation list decoding.

One or more aspects of the present invention are set out in the independent claims, with advantageous features of the same invention that are indicated in the dependent claims, whose wording is enclosed herein verbatim by reference (with any advantageous feature being provided with reference to a specific aspect of the present invention that applies mutatis mutandis to any other aspect thereof).

More specifically, an aspect of the present invention relates to a method for operating a controller of a solid state storage device. The method comprises:

encoding information and frozen bits with a polar code thereby obtaining polar encoded bits;

storing said polar encoded bits in memory cells of the solid state storage device;

reading the polar encoded bits stored in the memory cells of the solid state storage device, the read polar encoded bits including the frozen bits and unfrozen bits indicative of said information bits;

performing a successive cancellation list (SCL) decoding of the read polar encoded bits.

Said performing a SCL decoding comprises:

providing a list of candidate decoding paths;

duplicating the candidate decoding paths included in the list of candidate decoding paths thereby obtaining duplicated candidate decoding paths;

determining a reliability of the unfrozen bits included in the duplicated candidate decoding paths;

determining a maximum list size indicative of an allowed maximum number of candidate decoding paths that can be contained in the list of candidate decoding paths based on a number of unfrozen bits included in the duplicated candidate decoding paths having a reliability below a predetermined threshold reliability;

pruning at least one duplicated candidate decoding path among the duplicated candidate decoding paths according to the determined maximum list size and updating the list of candidate decoding paths by including in the list of candidate decoding paths a number of non-pruned duplicated candidate decoding paths not higher than the maximum list size, and selecting a decoding path from the list of candidate decoding paths thereby obtaining the information bits.

According to an embodiment of the present invention,
said duplicating the candidate decoding paths included in the list of candidate decoding paths,
said determining a reliability of the unfrozen bits included in the duplicated candidate decoding paths,
said determining a maximum list size, and
said pruning at least one duplicated candidate decoding path among the duplicated candidate decoding paths and said updating the list of candidate decoding paths
are iterated before said selecting a decoding path from the list of candidate decoding paths.

According to an embodiment of the present invention, said determining a maximum list size comprises, at each current iteration:

increasing the maximum list size by a first predetermined amount if the number of unfrozen bits whose reliability is below the predetermined reliability threshold has increased, between a previous iteration before the current iteration and the current iteration, by at least a first predetermined number, or decreasing the maximum list size by a second predetermined amount if the number of unfrozen bits whose reliability is below the predetermined reliability threshold has decreased, between the previous iteration and the current iteration, by at least a second predetermined number.

According to an embodiment of the present invention, at least one between the first and second predetermined amounts and the first and second predetermined numbers are determined according to at least one parameter of the solid state storage device.

According to an embodiment of the present invention, said at least one parameter of the solid state storage device comprises at least one among a code rate of the polar encoded bits and a storage availability of the solid state storage device.

According to an embodiment of the present invention, said determining a reliability of the unfrozen bits included in the duplicated candidate decoding paths comprises:

determining, for each duplicated candidate decoding path, a metric indicative of a reliability of said duplicated candidate decoding path according to the reliability of the unfrozen bits included in said duplicated candidate decoding path, and determining a metric range indicative of a difference between a highest-metric duplicated candidate decoding path and a lowest-metric duplicated candidate decoding path, wherein said determining a maximum list size comprises, at each iteration, varying the maximum list size according to a change in the metric range.

According to an embodiment of the present invention, said varying the maximum list size according to a change in the metric range comprises:

increasing the maximum list size by a first predetermined list size amount if the metric range has decreased, between a previous iteration before the current iteration and the current iteration, by at least a first predetermined metric range amount, or decreasing the maximum list size by a second predetermined list size amount if the metric range has increased, between the previous iteration and the current iteration, by at least a second predetermined metric range amount.

According to an embodiment of the present invention, at least one between the first and second predetermined list size amounts and the first and second predetermined metric ranges are determined according to at least one parameter of the solid state storage device.

According to an embodiment of the present invention, said at least one parameter of the solid state storage device comprises at least one among a code rate of the polar encoded bits and a storage availability of the solid state storage device.

According to an embodiment of the present invention, said determining a reliability of the unfrozen bits comprises associating a Log Likehood Ratio (LLR) value with each one of the unfrozen bits.

According to an embodiment of the present invention, the unfrozen bits having a reliability below a predetermined reliability threshold comprise at least one among:

unfrozen bits associated with one or more rows of a generator matrix having weight below a predetermined threshold weight, the generator matrix generating the polar encoded bits;

unfrozen bits associated with channels having average Log Likehood Ratio (LLR) value below a predetermined threshold average LLR value, and unfrozen bits associated with channels having error probability above a predetermined threshold error probability.

Another aspect of the present invention relates to a controller for a solid state storage device. The controller comprises:

an encoding unit for encoding information and frozen bits with a polar code, thereby obtaining polar encoded bits to be stored in memory cells of the solid state storage device, a decoding unit for performing a successive cancellation list (SCL) decoding of read polar encoded bits being read from the memory cells of the solid state storage device, the read polar encoded bits including the frozen bits and unfrozen bits indicative of said information bits.

The decoding unit is configured to perform:
providing a list of candidate decoding paths;
duplicating the candidate decoding paths included in the list of candidate decoding paths thereby obtaining duplicated candidate decoding paths;
determining a reliability of the unfrozen bits included in the duplicated candidate decoding paths;
determining a maximum list size indicative of an allowed maximum number of candidate decoding paths that can be contained in the list of candidate decoding paths based on a number of unfrozen bits included in the duplicated candidate decoding paths having a reliability below a predetermined threshold reliability;
pruning at least one duplicated candidate decoding path among the duplicated candidate decoding paths according to the determined maximum list size and updating the list of candidate decoding paths by including in the list of candidate decoding paths a number of non-pruned duplicated candidate decoding paths not higher than the maximum list size, and
selecting a decoding path from the list of candidate decoding paths thereby obtaining the information bits.

According to an embodiment of the present invention, the decoding unit is configured to iterate:
said duplicating the candidate decoding paths included in the list of candidate decoding paths,
said determining a reliability of the unfrozen bits included in the duplicated candidate decoding paths,
said determining a maximum list size, and
said pruning at least one duplicated candidate decoding path among the duplicated candidate decoding paths and said updating the list of candidate decoding paths, before said selecting a decoding path from the list of candidate decoding paths.

According to an embodiment of the present invention, the decoding unit is configured to, at each current iteration:

increase the maximum list size by a first predetermined amount if the number of unfrozen bits whose reliability is below the predetermined reliability threshold has increased, between a previous iteration before the current iteration and the current iteration, by at least a first predetermined number, or decrease the maximum list size by a second predetermined amount if the number of unfrozen bits whose reliability is below the predetermined reliability threshold has decreased, between the previous iteration and the current iteration, by at least a second predetermined number.

According to an embodiment of the present invention, at least one between the first and second predetermined amounts and the first and second predetermined numbers are determined according to at least one parameter of the solid state storage device.

According to an embodiment of the present invention, said at least one parameter of the solid state storage device comprises at least one among a code rate of the polar encoded bits and a storage availability of the solid state storage device.

According to an embodiment of the present invention, the decoding unit is configured to:

determine, for each duplicated candidate decoding path, a metric indicative of a reliability of said duplicated candidate decoding path according to the reliability of the unfrozen bits included in said duplicated candidate decoding path, and determine a metric range indicative of a difference between a highest-metric duplicated candidate decoding path and a lowest-metric duplicated candidate decoding path, the decoding unit being further configured to vary, at each iteration, the maximum list size according to a change in the metric range.

According to an embodiment of the present invention, the decoding unit is configured to vary the maximum list size by:

increasing the maximum list size by a first predetermined list size amount if the metric range has decreased, between a previous iteration before the current iteration and the current iteration, by at least a first predetermined metric range amount, or decreasing the maximum list size by a second predetermined list size amount if the metric range has increased, between the previous iteration and the current iteration, by at least a second predetermined metric range amount.

According to an embodiment of the present invention, at least one between the first and second predetermined list size amounts and the first and second predetermined metric ranges are determined according to at least one parameter of the solid state storage device.

According to an embodiment of the present invention, said at least one parameter of the solid state storage device comprises at least one among a code rate of the polar encoded bits and a storage availability of the solid state storage device.

According to an embodiment of the present invention, the decoding unit is configured to determine a reliability of the unfrozen bits by associating a Log Likehood Ratio (LLR) value with each one of the unfrozen bits.

According to an embodiment of the present invention, the unfrozen bits having a reliability below a predetermined reliability threshold comprise at least one among:

unfrozen bits associated with one or more rows of a generator matrix having weight below a predetermined threshold weight, the generator matrix generating the polar encoded bits;

unfrozen bits associated with channels having average Log Likehood Ratio (LLR) value below a predetermined threshold average LLR value, and unfrozen bits associated with channels having error probability above a predetermined threshold error probability.

Another aspect of the present invention relates to a solid state storage device comprising:

an encoding unit for encoding information and frozen bits with a polar code, thereby obtaining polar encoded bits, memory cells for storing the polar encoded bits, reading circuitry for reading the polar encoded bits from the memory cells, a decoding unit for performing a successive cancellation list (SCL) decoding of the read polar encoded bits, the read polar encoded bits including the frozen bits and unfrozen bits indicative of said information bits.

The decoding unit is configured to perform:

providing a list of candidate decoding paths;

duplicating the candidate decoding paths included in the list of candidate decoding paths thereby obtaining duplicated candidate decoding paths;

determining a reliability of the unfrozen bits included in the duplicated candidate decoding paths;

determining a maximum list size indicative of an allowed maximum number of candidate decoding paths that can be contained in the list of candidate decoding paths based on a number of unfrozen bits included in the duplicated candidate decoding paths having a reliability below a predetermined threshold reliability;

pruning at least one duplicated candidate decoding path among the duplicated candidate decoding paths according to the determined maximum list size and updating the list of candidate decoding paths by including in the list of candidate decoding paths a number of non-pruned duplicated candidate decoding paths not higher than the maximum list size, and selecting a decoding path from the list of candidate decoding paths thereby obtaining the information bits.

According to an embodiment of the present invention, the decoding unit is configured to iterate:

said duplicating the candidate decoding paths included in the list of candidate decoding paths, said determining a reliability of the unfrozen bits included in the duplicated candidate decoding paths, said determining a maximum list size, and said pruning at least one duplicated candidate decoding path among the duplicated candidate decoding paths and said updating the list of candidate decoding paths, before said selecting a decoding path from the list of candidate decoding paths.

According to an embodiment of the present invention, the decoding unit is configured to, at each current iteration:

increase the maximum list size by a first predetermined amount if the number of unfrozen bits whose reliability is below the predetermined reliability threshold has increased, between a previous iteration before the current iteration and the current iteration, by at least a first predetermined number, or decrease the maximum list size by a second predetermined amount if the number of unfrozen bits whose reliability is below the predetermined reliability threshold has decreased, between the previous iteration and the current iteration, by at least a second predetermined number.

According to an embodiment of the present invention, at least one between the first and second predetermined amounts and the first and second predetermined numbers are determined according to at least one parameter of the solid state storage device.

According to an embodiment of the present invention, said at least one parameter of the solid state storage device comprises at least one among a code rate of the polar encoded bits and a storage availability of the solid state storage device.

According to an embodiment of the present invention, the decoding unit is configured to:

determine, for each duplicated candidate decoding path, a metric indicative of a reliability of said duplicated candidate decoding path according to the reliability of the unfrozen bits included in said duplicated candidate decoding path, and determine a metric range indicative of a difference between a highest-metric duplicated candidate decoding path and a lowest-metric duplicated candidate decoding path, the decoding unit being further configured to vary, at each iteration, the maximum list size according to a change in the metric range.

According to an embodiment of the present invention, the decoding unit is configured to vary the maximum list size by:

increasing the maximum list size by a first predetermined list size amount if the metric range has decreased, between a previous iteration before the current iteration and the current iteration, by at least a first predetermined metric range amount, or decreasing the maximum list size by a second predetermined list size amount if the metric range has increased, between the previous iteration and the current iteration, by at least a second predetermined metric range amount.

According to an embodiment of the present invention, at least one between the first and second predetermined list size amounts and the first and second predetermined metric ranges are determined according to at least one parameter of the solid state storage device.

According to an embodiment of the present invention, said at least one parameter of the solid state storage device comprises at least one among a code rate of the polar encoded bits and a storage availability of the solid state storage device.

According to an embodiment of the present invention, the decoding unit is configured to determine a reliability of the unfrozen bits by associating a Log Likehood Ratio (LLR) value with each one of the unfrozen bits.

According to an embodiment of the present invention, the unfrozen bits having a reliability below a predetermined reliability threshold comprise at least one among:

unfrozen bits associated with one or more rows of a generator matrix having weight below a predetermined threshold weight, the generator matrix generating the polar encoded bits;

unfrozen bits associated with channels having average Log Likehood Ratio (LLR) value below a predetermined threshold average LLR value, and unfrozen bits associated with channels having error probability above a predetermined threshold error probability.

According to an embodiment of the present invention, the memory cells are flash memory cells.

According to an embodiment of the present invention, said memory cells are NAND flash memory cells.

BRIEF DESCRIPTION OF THE ANNEXED DRAWINGS

These and other features and advantages of the present invention will be made apparent by the following description of some exemplary and non-limitative embodiments thereof. For its better intelligibility, the following description should be read making reference to the attached drawings, wherein:

FIG. 1A schematically shows a simplified architecture of a SSD device known in the state of the art;

FIG. 1B schematically shows a simplified architecture of a typical SSD controller of said SSD device;

FIG. 2A schematically shows a simplified architecture of a typical flash memory die of said SSD device;

FIGS. 2B and 2C schematically show exemplary ideal and real threshold voltage distributions of MLC memory cells and of TLC memory cells, respectively, of said flash memory die;

FIG. 3A schematically shows a simplified architecture of a SSD controller according to an embodiment of the present invention;

Figure 3A:
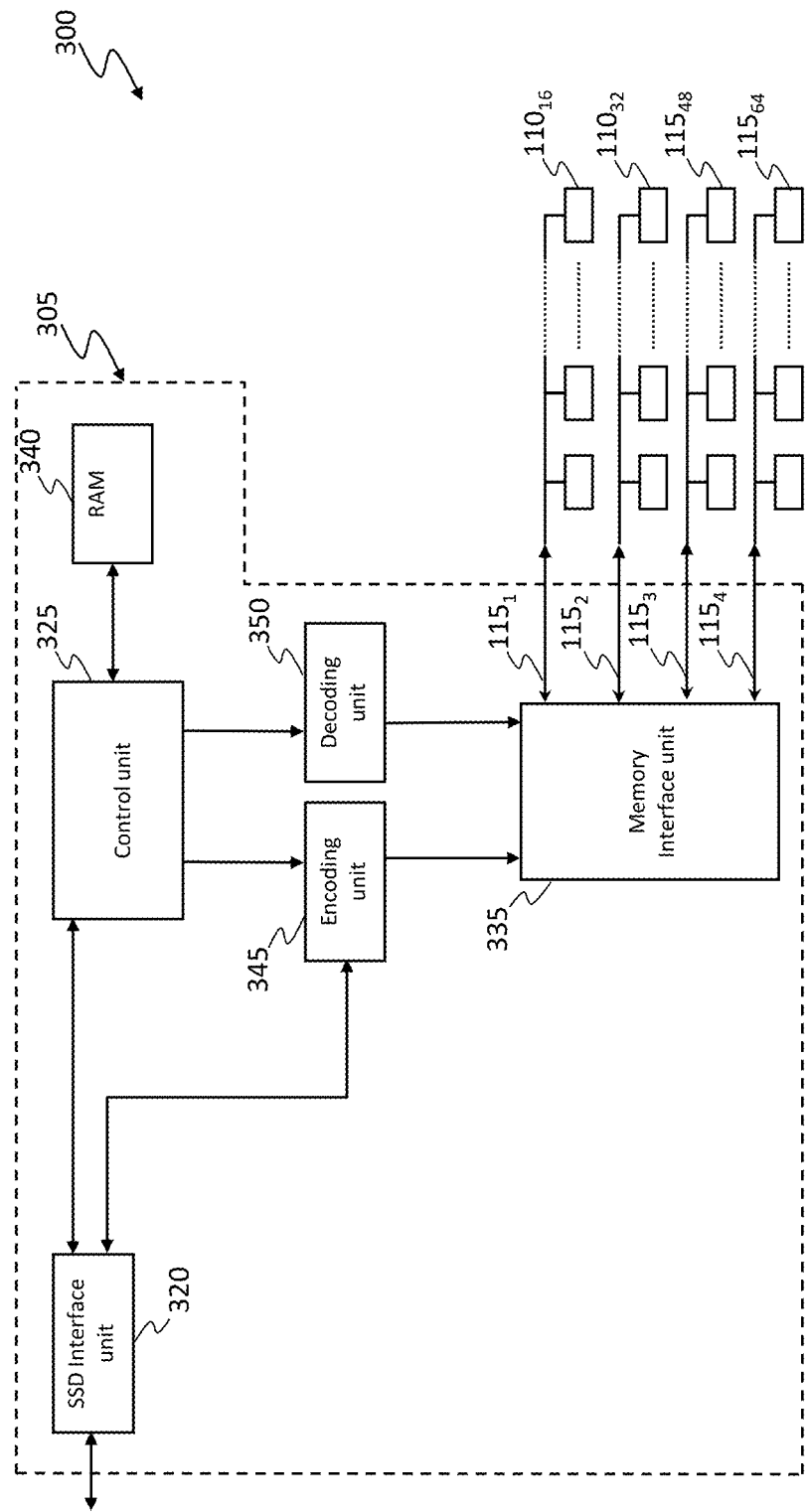
FIG. 3B shows an exemplary encoding scheme of polar encoding.
FIG. 3C shows an exemplary successive cancellation decoding scheme that may be applied to polar encoded bits.
FIG. 3D shows an exemplary successive cancellation list decoding scheme as compared to the successive cancellation decoding scheme of FIG. 3C.
Figure 3B:
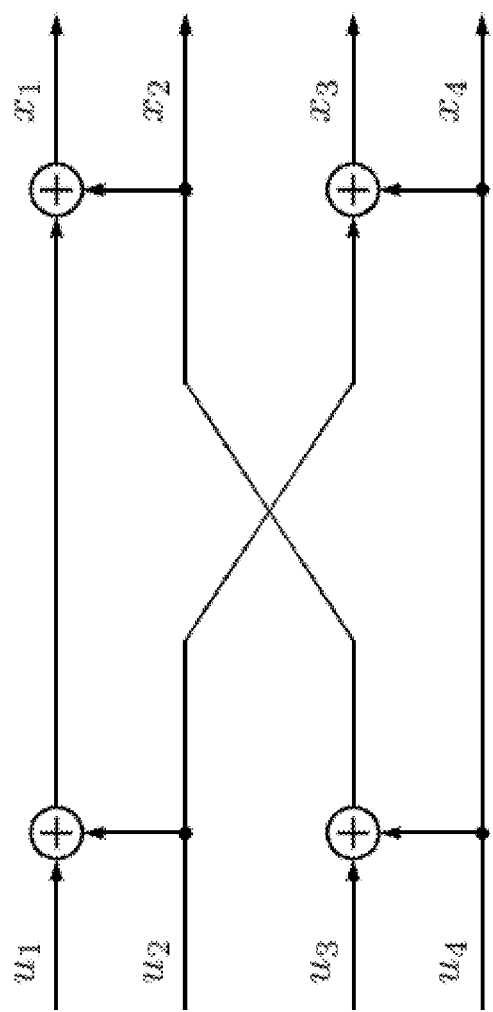
Figure 3C:
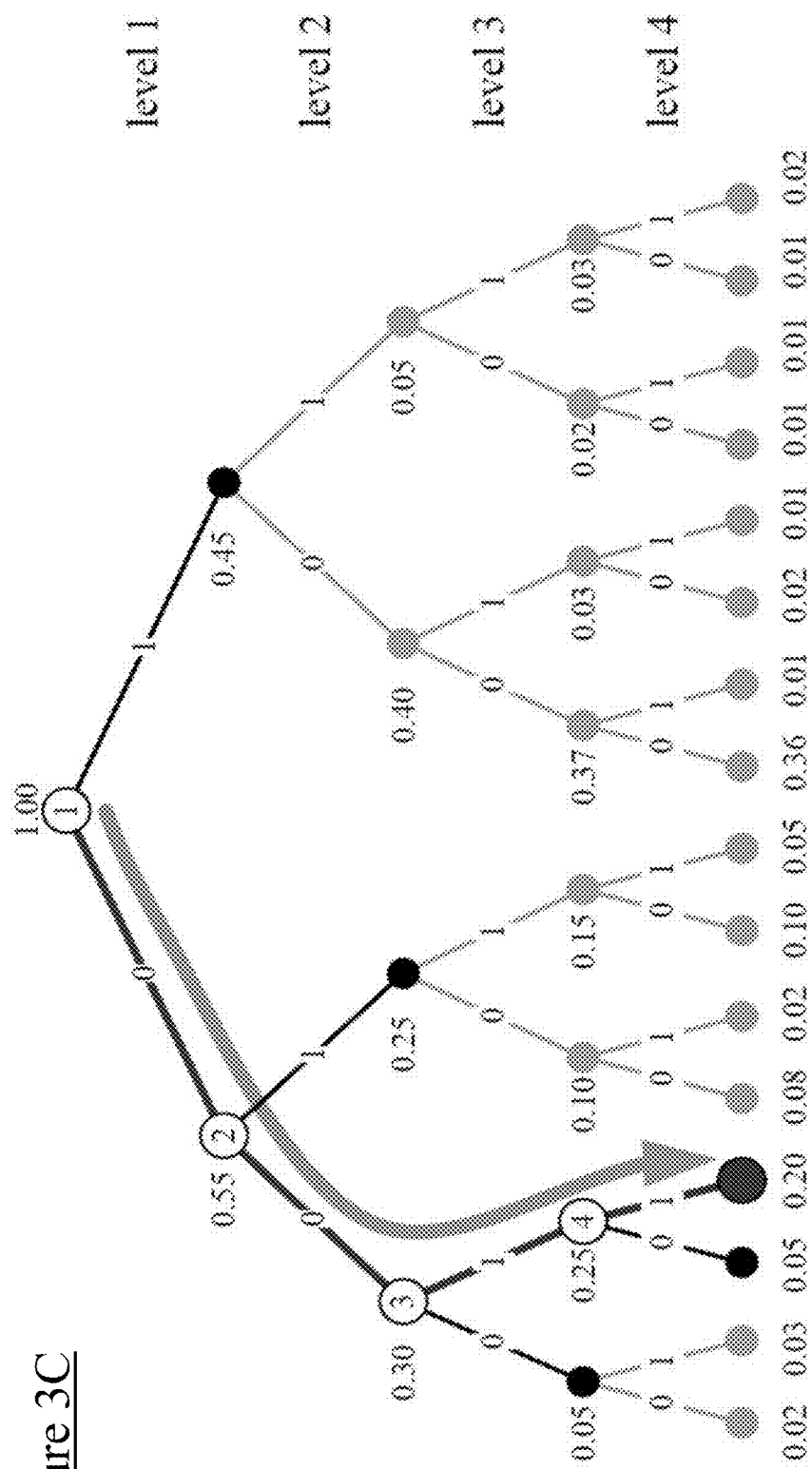
Figure 3D:
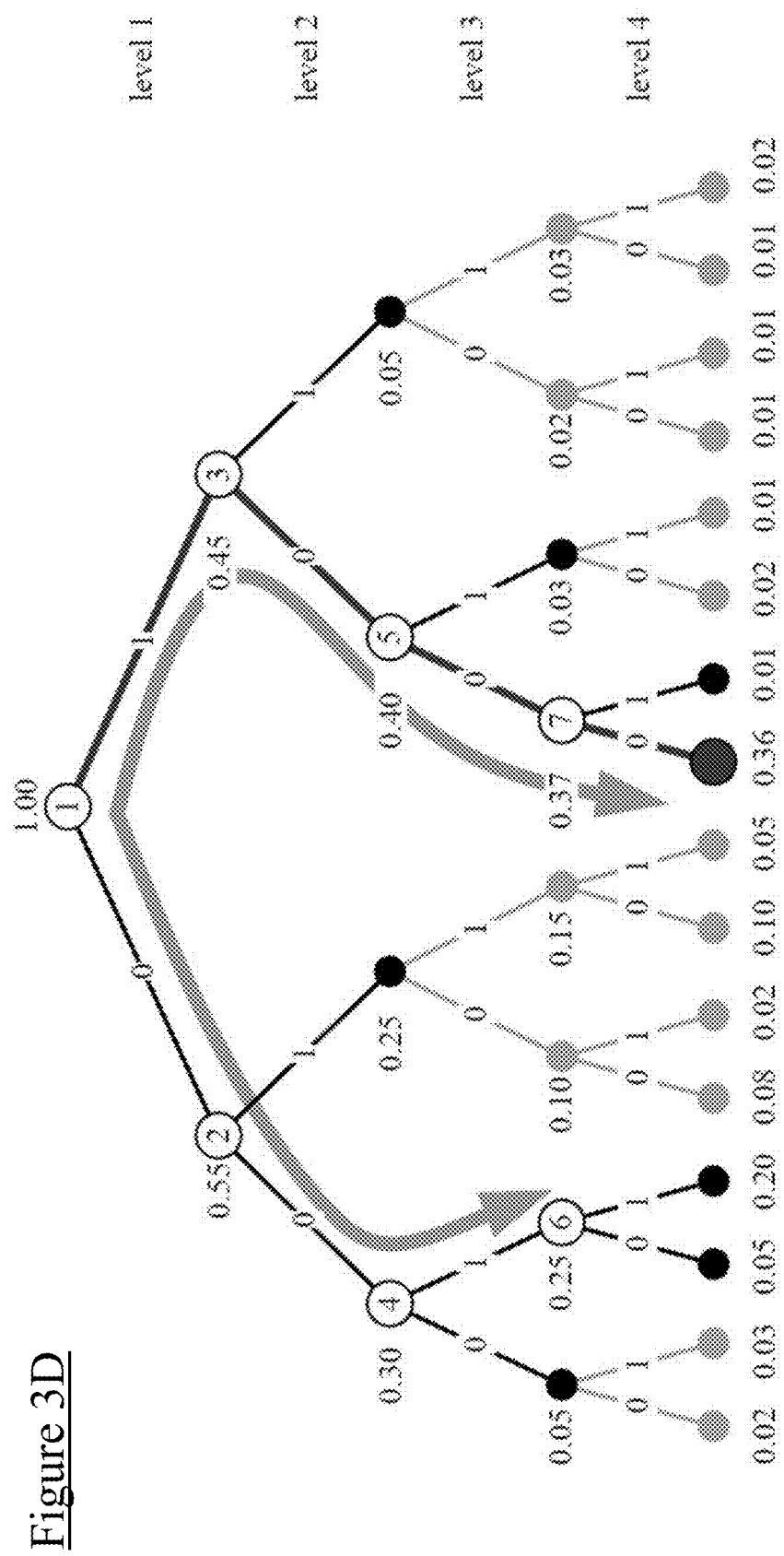
Figure 3E:
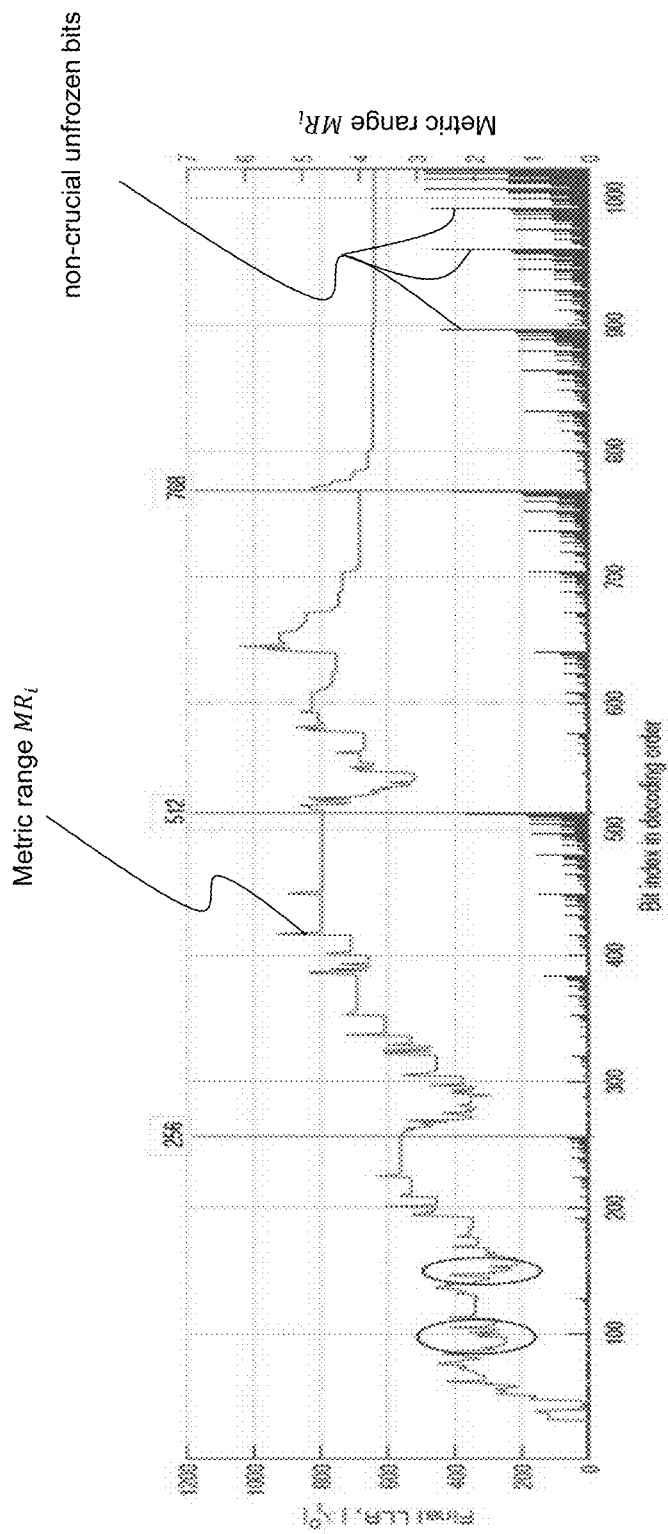
Figure 3F:
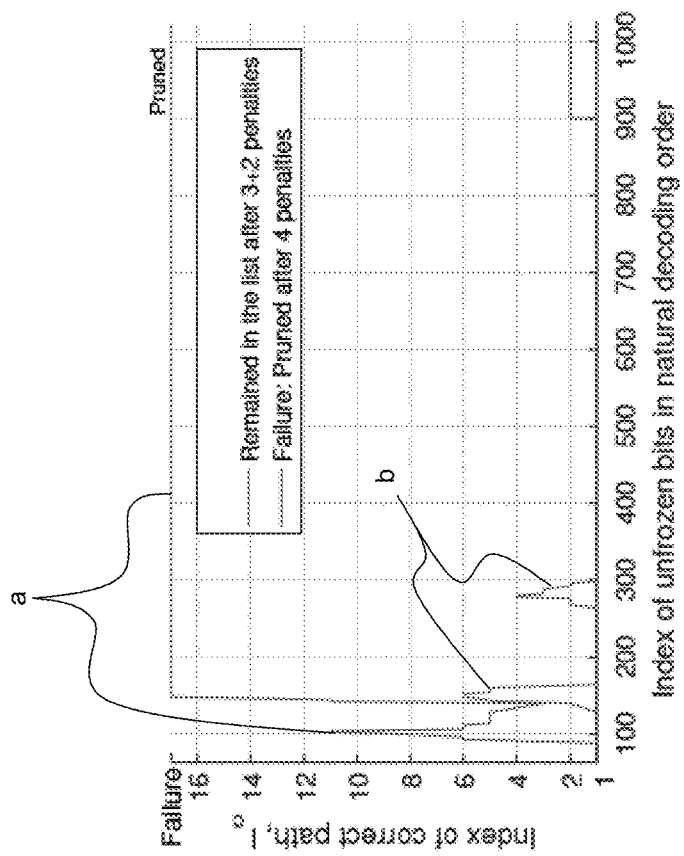

FIG. 3E shows a relationship between a metric range and LLRs that can be used for dynamically determining a maximum list size in successive cancellation list decoding, according to an embodiment of the present invention, and FIG. 3F shows an exemplary decoding path selection scenario based on both the convention successive cancellation list decoding and on the successive cancellation list decoding implementing the maximum list size according to an embodiment of the present invention.

DETAILED DESCRIPTION OF PREFERRED EMBODIMENTS OF THE INVENTION

Figure 1A:
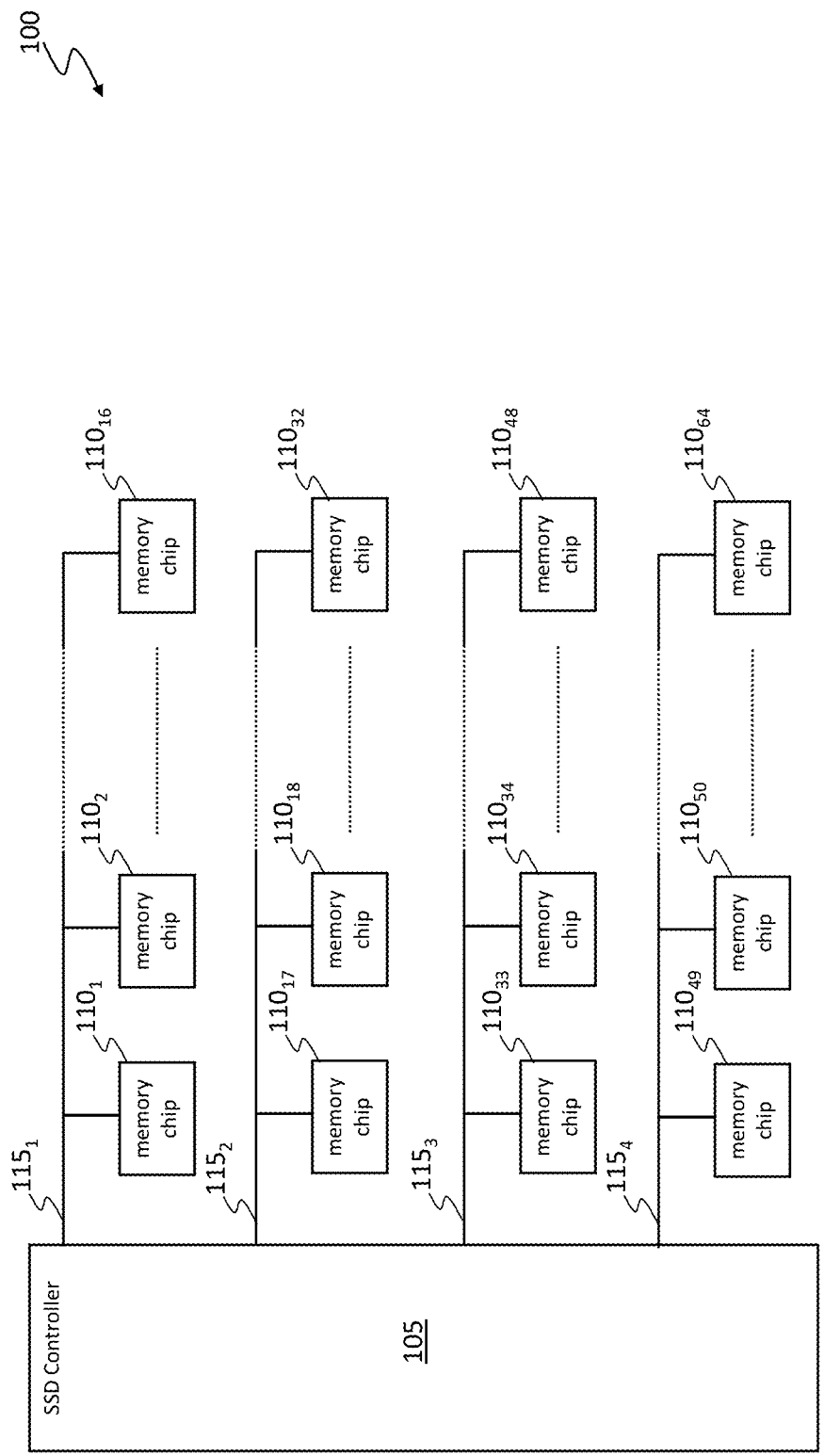

With reference to the drawings, FIG. 1A schematically shows a simplified architecture of a "Solid State Drive" device (SSD device) 100 known in the state of the art.

The SSD device 100 preferably comprises a controller (e.g., a processor and/or other control circuitry, referred to herein as SSD controller) 105, a plurality of non-volatile memory chips (e.g. flash memory chips, such as NAND flash memory chips) $110_m$ for storing bits even in the absence of external power supply (m=1,2,3, . . . with M=64 in the example at issue), and a plurality of (e.g., synchronous and/or asynchronous) channels $115_h$ (h=1,2,3, . . . , H, with H=4 in the example at issue) communicably coupling the SSD controller 105 and the memory chips $110_m$ to each other—in the exemplary illustration, each channel $115_h$ communicably couples the SSD controller 105 to a set of 16 memory chips $110_m$ (e.g., with the channels $115_1$, $115_2$, $115_3$ and $115_4$ that communicably couple the SSD controller 105 to the memory chips $110_1$-$110_{16}$, $110_{17}$-$110_{32}$, $110_{33}$-$110_{48}$ and $110_{49}$-$110_{64}$, respectively).

Figure 1B:
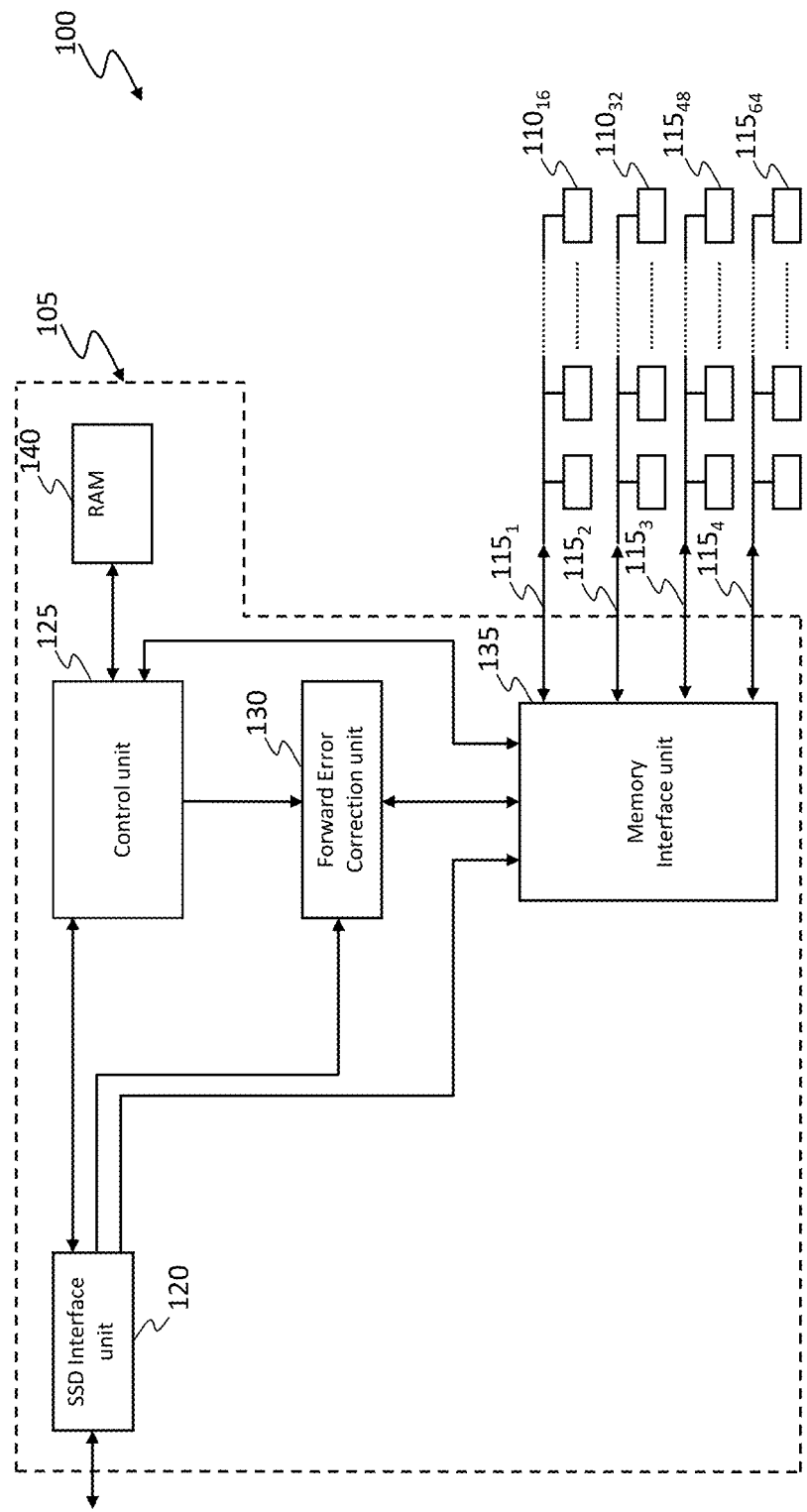

With reference also to FIG. 1B, it schematically shows, in terms of operating units, a simplified architecture of a typical SSD controller 105—the term "unit" being herein intended to emphasize functional (rather than implementation) aspects thereof (each unit including, for example, hardware or circuitry with processing and/or storing capabilities). For the sake of completeness, such a figure also shows, with a smaller size, the memory chips $110_m$ and the channels $115_h$ (only some of them being numbered in such a figure for ease of illustration).

The SSD controller 105 comprises a SSD interface unit 120 allowing data exchange (i.e., data sending and reception in a bi-directional way) between the SSD device 100 and a host (e.g., a host system such as a personal laptop computer, a desktop computer, a digital camera, a mobile telephone, or a memory card reader, not shown) having compatible receptors for the SSD interface unit 120. The SSD interface unit 120 may be in the form of a standardized interface. For example, when the SSD device 100 is used for data storage in a computing system, the SSD interface unit 120 can be a "Serial advanced technology attachment" (SATA), a "Peripheral Component Interconnect express" (PCIe), or a "Universal Serial Bus" (USB). Data exchanged between the SSD device 100 (through the SSD interface unit 120 of the SSD controller 105) and the host may comprise, but is not limited to, information bits to be stored (i.e., the information bits to be written in the memory chips $110_m$), read information bits (i.e., the information bits stored in, and read from, the memory chips $110_m$), user commands indicative of the operations to be performed by the SSD controller 105 on the memory chips $110_m$ (such as write, read, diagnosis operations), and other control signals. For the purposes of the present description, the wording "data exchange", and derivative thereof, will be intended to mean a bi-directional exchange (i.e., sending and reception) of data between two units (although this should not be construed limitatively). This is also conceptually represented in the figure by bi-directional arrow connections between the units.

The SSD controller 105 also comprises a control unit 125 (or more thereof) for managing SSD device 100 operation, such as for receiving and processing the user commands from the SSD interface unit 120, handling bit transport to the memory chips $110_m$ along the channels $115_h$ and bit transport to and from the SSD interface unit 120, and coordinating enabling and/or disabling of the memory chips $110_m$ according to the user commands.

In order to compensate for large "Raw Bit Error Rate" (RBER), and to increase reliability of the SSD device 100, the SSD controller 105 also comprises a "Forward Error Correction" (FEC) unit 130 for locating and correcting bit errors. According to "Forward Error Correction" principles, the information bits to be stored in the memory chips $110_m$ (and provided either by the control unit 125 or, directly, from the SSD interface unit 105) are encoded in a redundant way (e.g., by adding parity bits) by means of an "Error Correction Code" (ECC code), so that redundancy allows detecting a limited number of bit errors that may occur anywhere in the read bits, and to correct these errors, during decoding, without rereading. The FEC unit 130 may comprise discrete components—such as an "Application Specific Integrated Circuit" (ASIC)—external to the control unit 125 (as herein assumed by way of example only), or the FEC unit 130 may reflect functionalities that do not necessarily have a discrete physical form separate from the control unit 125.

In order to ease bit transport between the SSD controller 105 and the memory chips $110_m$ along the respective channels $115_h$, the SSD controller 105 comprises one (as herein exemplary illustrated) or more memory interface units 135—alternatively, a memory interface unit 135 for each channel $115_h$ may be provided, or a memory interface unit 135 for each memory chip $110_m$, or for each group of memory chips $110_m$ may be provided.

As conceptually depicted in the figure by (unidirectional or bi-directional) arrow connections, which however should not be construed limitatively, the memory interface unit 135 is communicably coupled in a unidirectional manner to the SSD interface 120 (e.g., for receiving from it the information bits to be written when no ECC code is requested), and in a bi-directional manner to the control unit 125 (e.g., for receiving control information from it, such as an indication of the memory chips $110_m$ to be enabled for write or read operations, and for providing to it the read bits to be transmitted to the SSD interface unit 120) and to the FEC unit 130 (for example, for receiving encoded bits from it, e.g. including the information and parity bits, and for providing to it the read bits to be decoded before transmitting to the control unit 125, and hence to the SSD interface unit 120, the read information bits).

The SSD controller 105 further comprises a memory unit (e.g., a "Random Access Memory", RAM) 140 communicably coupled (in a bi-directional manner) to the control unit 125 for receiving and storing statistical information (such as number of program/erase cycles, and number of bit errors) and/or diagnostic information (such as working temperature, power consumption) retrieved and/or calculated by the control unit 125 (e.g. based on SSD device 100 operation and/or on sensors and/or diagnostic circuits within the SSD device 100, not shown), and, when required, for feeding the control unit 125 with the stored information.

A typical flash memory chip $110_m$ may comprise one or more flash memory dice.

Figure 2A:
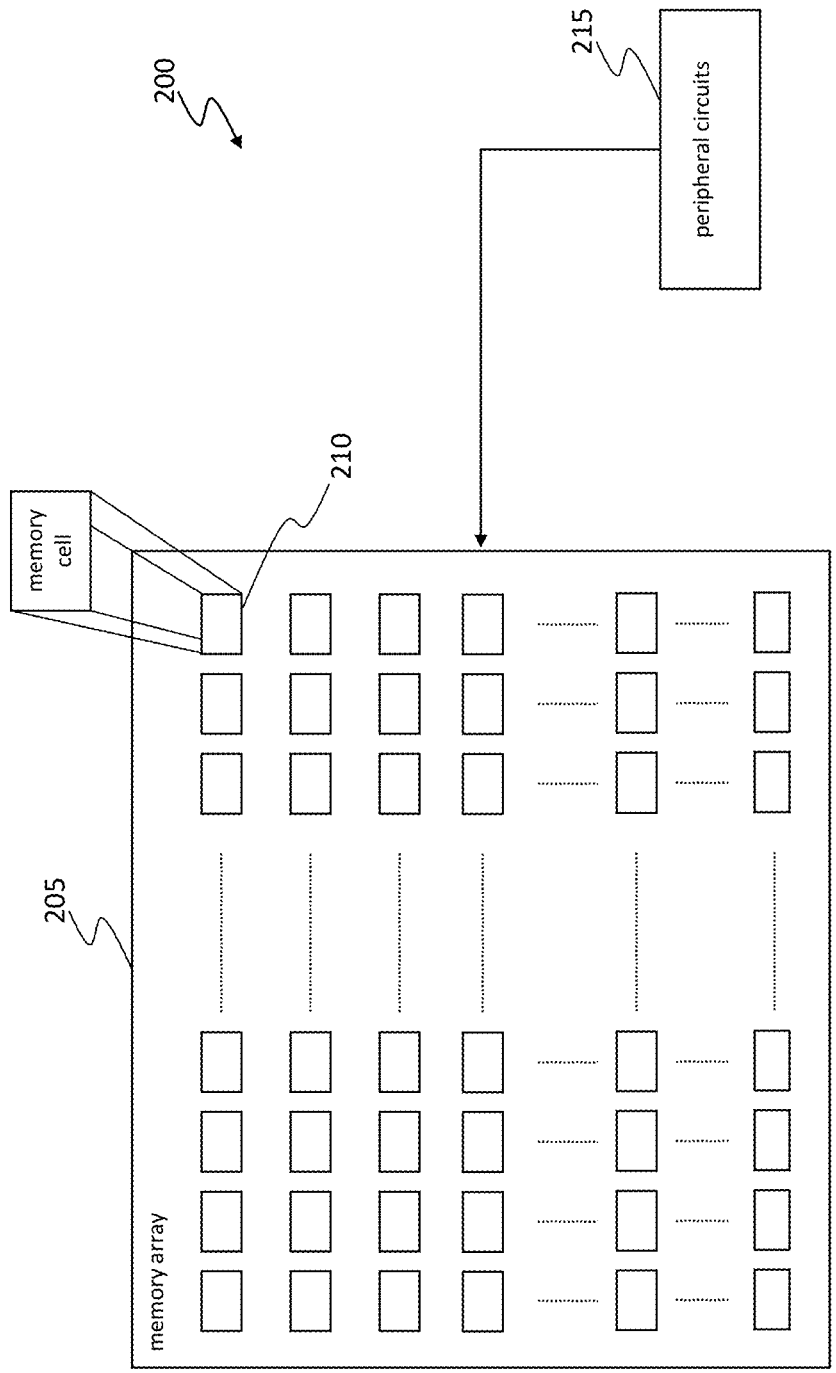

A typical flash memory die, illustrated in FIG. 2A and denoted by the number reference 200, comprises one (as depicted) or more memory arrays 205 of memory cells (e.g., NAND flash memory cells) 210 arranged in rows and columns. Each memory array 205 is typically divided into multiple memory pages. Broadly speaking, each memory page comprises a number of memory cells 210 that can be programmed and read simultaneously. A number of memory pages form a memory block, and the size of the memory block equals to the product of the size of the memory page and the total number of memory pages in the memory block.

Each memory cell 210 preferably comprises a floating gate transistor (not illustrated). Each bit or group of bits (or symbol, or bit pattern) identifying a respective logical state of the memory cell 210 is physically stored in each memory cell 210 in the form of electric charge in the floating gate, which defines a corresponding threshold voltage of the transistor. The number of bits each memory cell 210 is capable of storing depends on memory cell technology. For example, in "Single-Level Cell" (SLC) technology each memory cell (or SLC memory cell) is capable of storing one symbol (or bit pattern) comprising one bit (i.e. two logical states, 0 or 1, defining, i.e. being associated with, two threshold voltages), in "Multi-Level Cell" (MLC) technology each memory cell (or MLC memory cell) is capable of storing one symbol (or bit pattern) comprising more than one bit, typically two bits (i.e. four logical states, 00, 01, 10, or 11, defining, i.e. being associated with, four threshold voltages), whereas in "Tri-Level Cell" technology each memory cell (or TLC memory cell) is capable of storing one symbol (or bit pattern) comprising three bits (i.e. eight logical states, 000, 001, 010, 011, 100, 101, 110 or 111, defining, i.e. being associated with, eight threshold voltages).

While, ideally, all memory cells 210 in the flash memory die 200 should feature same (nominal) threshold voltages for same logical states (or, equivalently, for same symbols), practically each threshold voltage associated with a corresponding logical state (or, equivalently, associated with a corresponding symbol) differs across the memory cells 210 and defines a respective threshold voltage distribution $D_j$ (typically, a Gaussian-type probability distribution), thus resulting in a number of threshold voltage distributions $D_j$ equal to the possible logical states each memory cell 210 can take (j=1, 2, ..., 4 for a MLC memory cell, and j=1, 2, ..., 8 for a TLC memory cell). This is schematically shown in the top drawing of FIG. 2B for a MLC memory cell and in the top drawing of FIG. 2C for a TCL memory cell.

Figure 2B:
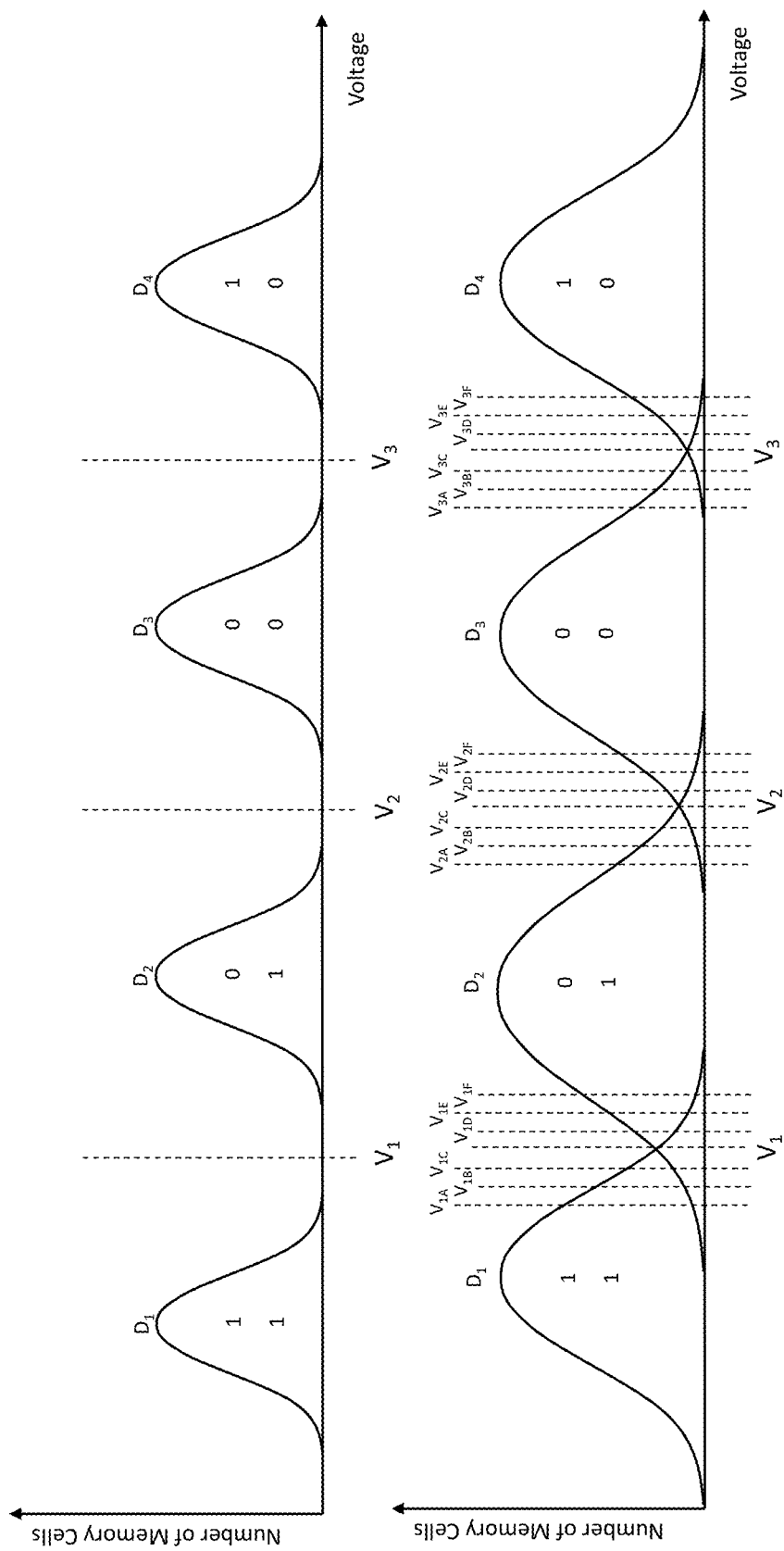
Figure 2C:
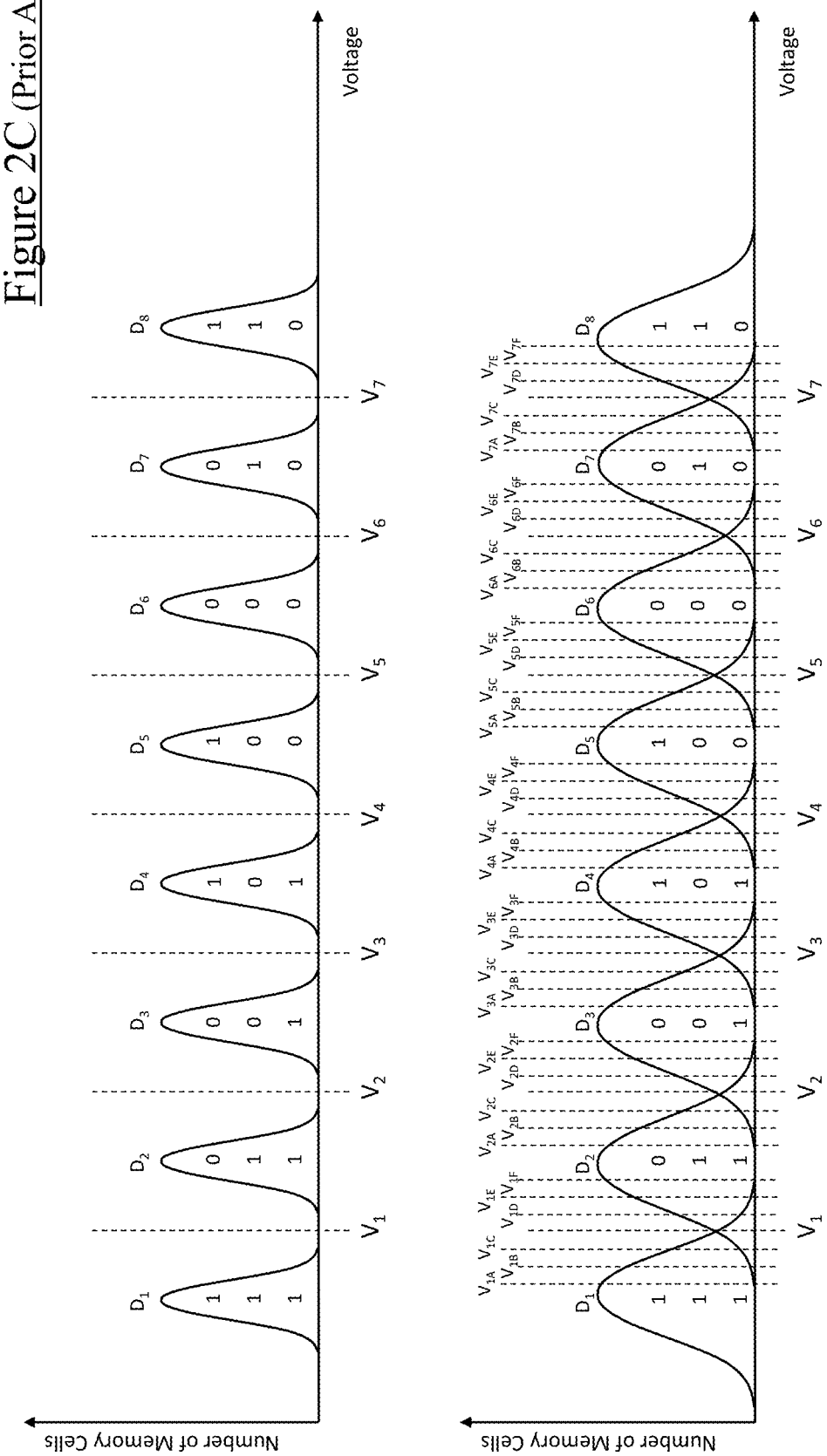

The threshold voltage distributions $D_j$ are (ideally) spaced apart from one another, and a corresponding hard reference voltage $V_k$ is set between each pair of adjacent threshold voltage distributions $D_j$ for sensing/reading the logical state of the memory cells 210 (k=1,2,3 in the example of FIG. 2B and k=1,2,3,4,5,6,7 in the example of FIG. 2C; k would instead be equal to 1 in case of a SLC memory cell).

In the case of SLC memory cell, not shown, during a read operation a threshold voltage below the hard reference voltage $V_1$ represents the symbol "1", and a threshold voltage above the hard reference voltage $V_1$ represents the symbol "0".

In the case of MLC memory cell, during a read operation, a threshold voltage below the hard reference voltage $V_1$ represents the symbol "11", a threshold voltage between the hard reference voltages $V_1$ and $V_2$ represents the symbol "01", a threshold voltage between the hard reference voltages $V_2$ and $V_3$ represents the symbol "00", and a threshold voltage above the hard reference voltage $V_3$ represents the symbol "10" (see top drawing of FIG. 2B).

In the case of TLC memory cell, during a read operation, a threshold voltage below the hard reference voltage $V_1$ represents the symbol "111", a threshold voltage between the hard reference voltages $V_1$ and $V_2$ represents the symbol "011", a threshold voltage between the hard reference voltages $V_2$ and $V_3$ represents the symbol "001", a threshold voltage between the hard reference voltages $V_3$ and $V_4$ represents the symbol "101", a threshold voltage between the hard reference voltages $V_4$ and $V_5$ represents the symbol "100", a threshold voltage between the hard reference voltages $V_5$ and $V_6$ represents the symbol "000", a threshold voltage between the hard reference voltages $V_6$ and $V_7$ represents the symbol "010", and a threshold voltage above the hard reference voltage $V_7$ represents the symbol "110" (see top drawing of FIG. 2C).

To read a memory cell 210, the threshold voltage of the memory cell 210 is compared to the hard reference voltages $V_k$. For example, reading a memory cell 210 that stores a symbol of m bits may require, for at least one page of memory cells (hereinafter, memory page), m such comparisons.

For example, when m=3, such as in the TLC memory cell, the threshold voltage is first compared to the hard reference voltage $V_4$. Depending on the outcome of that comparison, the threshold voltage is then compared either to the hard reference voltage $V_2$ or to the hard reference voltage $V_6$. Depending on the outcome of the second comparison, the threshold voltage is then compared either to the hard reference voltages $V_1$ or $V_3$ or to the hard reference voltages $V_5$ or $V_7$.

Back to FIG. 2A, the memory die 200 preferably comprises peripheral circuits (such as decoders, multiplexers, drivers, buffers, sense amplifiers), which, being not relevant for the present description, are represented in the figure by means of a single functional block (denoted by the number reference 215). Such peripheral circuits 215 are configured, in general, for accessing selected (pages of) memory cells (as conceptually represented in the figure by arrow connection between the peripheral circuits 215 and the memory array 205) and for running selected operations thereon (e.g. write, read, diagnosis operations).

The increasing of the number of bits per memory cell causes, for a same threshold voltage distribution space (i.e., for the same allowed maximum and minimum threshold voltages), a higher number of threshold voltage distributions. A higher number of threshold voltage distributions in the same threshold voltage distribution space results in threshold voltage distributions that are closer to each other. This makes the memory cells more prone to suffer severe cell-to-cell interference, mainly arising from floating gate coupling effect between a target memory cell (i.e., a memory cell to be read or written) and the surrounding memory cells, and retention, i.e. a loss of the capability of the memory cells to retain the stored bits over time caused by progressive damage of the oxide layer (due to the high electrical fields applied at each program/erase operation) that determines an undesired flow of electrons away/in the floating gate.

Cell-to-cell interference and retention translate into partially overlapping areas of adjacent threshold voltage distributions $D_j$ (shown in the bottom drawings of FIG. 2B and 2C) and, hence, into increasing of the probability of the number of bit errors per unit time (i.e., the RBER).

With reference now to FIG. 3A, it schematically shows, in terms of operating units, a simplified architecture of a SSD controller 305 according to an embodiment the present invention. For the sake of completeness, such a figure also shows, in a smaller size, the memory chips $110_m$ and the channels $115_h$ (only some of them being numbered in such a figure for ease of illustration), which identify, together with the SSD controller 305, a SSD device 300. Similarly to the above, the term "unit" is herein intended to emphasize functional (rather than implementation) aspects thereof. Indeed, without losing of generality, each unit of the SSD controller 305 may be physically implemented by software, hardware, and/or a combination thereof, and/or within any pre-existing or dedicated entity. In this respect, the operating units may also intended to represent corresponding method steps of a method according to the present invention.

As visible in the figure, the SSD controller 305 comprises a SSD interface 320, a control unit 325, a memory interface unit 335, and a memory unit 340, which are respectively similar to the SSD interface 120, the control unit 125, the memory interface unit 135, and the memory unit 140 of the SSD controller 105, and therefore they will not be discussed again for the sake of conciseness.

The SSD controller 305 also comprises an encoding unit 345 for encoding the bits to be stored in the memory array 205 (i.e., the information bits) by means of an ECC code, and a decoding unit 350 for decoding the read bits and determining the information bits. According to an embodiment of the present invention, the encoding 345 and decoding 350 units are implemented in the FEC unit (not shown in this figure).

Preferably, the ECC code is an ECC code allowing soft decoding—or, otherwise stated, an ECC code that allows determining each bit value (or bit pattern value or symbol value, when considering MLC and TLC memory cells) by means of hard bits (i.e., the read bits resulting from comparisons to the hard reference voltages $V_k$) and of additional information including soft bits and an indication of the reliability of each read (hard and soft) bit. The soft bits preferably arise from multiple read operations. Indeed, when a read operation takes place on the selected memory cells, and the number of bit errors is found to be higher than correction capabilities of the "Forward Error Correction", the SSD controller 305 is configured to reread the selected memory cells at different values of the reference voltages to attempt to establish the bits in those areas of the threshold voltage distributions $D_j$ wherein bit error is most likely. As visible in the bottom drawings of FIGS. 2B and 2C, such multiple readings are carried out by moving the hard reference voltages $V_k$ in a neighborhood thereof, thus obtaining a number of additional reference voltages (or soft reference voltages) $V_{kA}$-$V_{kF}$ associated with each hard reference voltage $V_k$—the read operations at the soft reference voltages $V_{kA}$-$V_{kF}$ provide the soft bits, and are typically denoted as soft read operations (as opposed to the read operations at the hard reference voltages $V_k$ providing the hard bits, which are typically denoted by hard read operations). In other words, the soft bits and the indication of the reliability of the read (hard and soft) bits provide additional information that can be used by the decoding unit to speed up and/or to quickly converge. By way of example only, the soft reference voltages $V_{kA}$-$V_{kC}$ may be obtained by progressively decreasing the hard reference voltage $V_k$ by a 0.5V step, whereas the soft reference voltages $V_{kD}$-$V_{kF}$ may be obtained by progressively increasing the hard reference voltage $V_k$ by a 0.5V step.

Preferably, the indication of the reliability of the read (hard and soft) bits is in the form of "Log Likelihood Ratio" values (LLR, hereinafter, LLR values) associated with those bits (in other words, each LLR value is a weight indicative of the probability that the read bit is correct). By way of example only, in order to meet one or more parity checks of the ECC code, an LLR value higher than 0 may indicate a bit that is more likely a 0 than a 1, while an LLR value lower than 0 may indicate a bit that is more likely a 1 than a 0. Further, a greater magnitude of the LLR value may indicate a higher probability or reliability. Thus, a bit with an LLR value equal to 15 is more likely to be a 0 than a bit with an LLR value equal to 5, and a bit with an LLR value equal to −15 is more likely to be a 1 than a bit with an LLR value equal to −5. An LLR value equal to 0 may instead indicate that the bit is equally likely to be a 0 or a 1 (and therefore correspond to a complete uncertainty about the bit value, i.e. the estimation is completely unreliable).

According to an embodiment of the present invention, the ECC code is a polar code—hence, the corresponding encoded bits will be referred to as polar encoded bits. Although not shown, the polar encoded bits are properly mapped into mapped polar encoded bits (the mapped polar encoded bits representing the symbols to be written/programmed), thereafter the symbols can be stored in the memory chips $110_m$ (by means of the memory interface unit 335 that transmits the symbols to the memory chips $110_m$, and thanks to control unit 325 action that controls addressing of the memory chips $110_m$ to be written/programmed). After a read operation, the read symbols are properly demapped (demapping and mapping operations being substantially reverse operations with respect to each other), therefore the (demapped) read symbols are decoded by the decoding unit 350 in order to extract the respective information bits.

Polar codes were introduced in 2009 (see E. Arikan, "*Channel Polarization: A method for Constructing Capacity Achieving Codes for Symmetric Binary-Input Memoryless Channels,*" IEEE Trans. Inform. Theory, vol. 55, pp. 3051-3073 (2009), and E. Arikan and E. Telatar, "*On the Rate of Channel Polarization*" in Proc. IEEE Int'l Symp. Inform. Theory, Seoul, South Korea, pp. 1493-1495 (2009)).

A polar code is a linear ECC code which is provably capacity-achieving.

Polar encoding can be described as follows. N input bits $u_i=(u_1, u_2, \ldots, u_N)$ including K information bits (which are variable bits) and N-K frozen bits (which are also referred to as fixed bits) are transformed into N codeword bits $x_i=(x_1, x_2, \ldots, x_N)$ through the linear transformation:

$$x_i = u_i G_N, \text{with } G_N = B_N G_2^{\oplus n}$$

where:

$$G_2 \triangleq \begin{bmatrix} 1 & 0 \\ 1 & 1 \end{bmatrix};$$

$G_N$ is called generator matrix of size $N \times N$;

$B_N$ is a $N \times N$ bit-reversal permutation matrix, and

"$\oplus n$" denotes the n-th Kronecker power.

Therefore, the polar encoded bits include the information and frozen bits encoded with a polar code.

The N-K frozen bits are used as a reference by the decoding algorithm implemented in the decoding unit 350 to determine whether an error has occurred due to noise in the channel $115_h$ (for example during storing and/or reading of the polar encoded bits into and/or from, respectively, the memory cells of the SSD device). For example, the known value (typically "0") of a frozen bit may be compared to the value determined through the decoding algorithm, to determine whether an error has occurred. When the polar encoded bits stored in the memory cells of the SSD device are read, and demapped, the read polar encoded bits include the frozen bits (which are fixed, and hence known and unchanged) and unfrozen bits indicative of said information bits (the unfrozen bits therefore corresponding to the information bits resulting from the read operation and whose decoding and error correction allow retrieving the original information bits).

FIG. 3B shows an exemplary encoding scheme of polar encoding for N=4 bits. In this case, the generator matrix G4 is:

$$G_4 = \begin{bmatrix} 1 & 0 & 0 & 0 \\ 1 & 0 & 1 & 0 \\ 1 & 1 & 0 & 0 \\ 1 & 1 & 1 & 1 \end{bmatrix}$$

and $x_i=[x_1=(u_1 \oplus u_2 \oplus u_3 \oplus u_4); x_2=(u_3 \oplus u_4); x_3=(u_2 \oplus u_4); x_4=u_4]$.

As mentioned in E. Arikan, "*Channel Polarization: A Method for Constructing Capacity-Achieving Codes for Symmetric Binary-Input Memoryless Channels*", IEEE Trans. Inf. Theory, vol. 55, no. 7, pp. 3051-3073, July 2009, polar codes can be decoded by a successive cancellation decoding algorithm. According to the successive cancellation decoding algorithm, an estimate $\hat{u}_i$ of the input bits $u_i$ is obtained based on the channel output $y_1^N$ (i.e., the read or output polar encoded bits/symbols) and all past estimates $\hat{u}_1^{i-1}$. If the input bit $u_i$ is a frozen bit, the estimate $\hat{u}_i$ is set to its known value, otherwise $$\hat{u}_i = h_i(y_1^N, \hat{u}_1^{i-1})$$

where $$h_i(y_1^N, \hat{u}_1^{i-1}) = \begin{cases} 0 & \text{if } \ln\left(\frac{W_N^{(i)}(y_1^N, \hat{u}_1^{i-1} | u_i = 0)}{W_N^{(i)}(y_1^N, \hat{u}_1^{i-1} | u_i = 1)}\right) > 0 \\ 1 & \text{otherwise} \end{cases}$$

In the above expression, $W_N^{(i)}=(W_N^{(1)}, W_N^{(2)}, \ldots, W_N^{(N)})$ represent the N transformed binary input channels that can be synthesized for the input bits $u_1^N=(u_1, u_2, \ldots, u_N)$, respectively, and $$\ln\left(\frac{W_N^{(i)}(y_1^N, \hat{u}_1^{i-1} | u_i = 0)}{W_N^{(i)}(y_1^N, \hat{u}_1^{i-1} | u_i = 1)}\right) = L_n^{(i)}[l]$$

represents the channel LLR.

FIG. 3C shows an exemplary successive cancellation decoding scheme. As visible in the figure, the successive cancellation decoding may be represented as a decoding path searching process on a code tree. For a polar code with code length N, the corresponding code tree is a full binary tree with N decoding levels or iterations (N=4 in the illustrated example). At each decoding level, only the one of two edges with larger probability is selected for further processing. The bold edges in FIG. 3C show the successive cancellation decoding path. The number in correspondence of each node provides a metric of the decoding path from the root to that node—the metric being indicative of a reliability of the decoding path, and being for example expressed as a posteriori probability (as typical in successive cancellation decoding).

The nodes which are extended during the successive cancellation decoding procedure are represented by the numbered circles, and the corresponding numbers indicate the processing order. The black circles represent the nodes which are visited (whose a posteriori probability metric is calculated) but failed in competition for further exploring, whereas the grey circles represent the nodes which are not visited during the searching process. In the shown example, four times of calculation of the a posteriori probability are required, one for each decoding level. However, the decoding path is not guaranteed to be the most probable one. As shown in the example, the decoding path "1000" has the largest probability as compared to the remaining decoding path, but it failed in the competition at the first decoding level.

The performance of successive cancellation decoding is limited by the bit-by-bit decoding strategy: if a bit is wrongly determined, there is no chance to correct it in the future decoding procedure. Theoretically, the performance of the maximum a posteriori probability (MAP) decoding can be achieved by traversing all the N-length decoding paths in the code tree. But this brute-force traverse takes exponential complexity and is difficult to be implemented.

In order to overcome these issues, an improved decoding algorithm called successive cancellation list decoding has been proposed in I. Tal and A. Vardy, "*List decoding of polar codes*," IEEE Int. Symp. Inform. Theory (ISIT), pp. 1-5, 2011, and in K. Chen, K. Niu, J. R. Lin, "*List successive cancellation decoding of polar codes*," Electronics Letters, vol. 48, no. 9, pp. 500-501, 2012. This decoding algorithm allows more than one edge to be explored in each decoding level of the code tree. For the purposes of the present invention, the decoding unit 350 is assumed to be based on successive cancellation list decoding.

The successive cancellation list decoding allows searching decoding level-by-decoding level on the code tree: however, unlike successive cancellation decoding where only one decoding path is reserved after processing at each decoding level, successive cancellation list decoding allows at most L candidate decoding paths to be further explored at the next decoding level: the L candidate decoding paths are included (i.e., stored) in a list of candidate decoding paths (the list of candidate decoding path having a fixed size, hereinafter list size, equal to L). Successive cancellation list decoding may be regarded as a breadth-first searching on the code tree with a searching width L.

At each decoding level, successive cancellation list decoding:

duplicates (i.e., doubles) the number of candidates decoding paths (thereby obtaining corresponding duplicated candidate decoding paths). Therefore, 2L duplicated or children candidate decoding paths are generated from L candidate decoding paths (or parent candidate decoding paths);

prunes one or more of the duplicated candidate decoding paths (e.g., by associating a bit 0 or a bit 1 to each of the duplicated candidate decoding paths, and then selecting at most L duplicated candidate decoding paths with largest metrics, for example the L duplicated candidate decoding paths with highest reliabilities), and updates the list of candidate decoding paths by including the non-pruned duplicated candidate decoding paths in the list of candidate decoding paths for iterating said duplication, pruning and updating operations at the next decoding level (in other words, at each decoding level, the L children, non-pruned duplicated candidate decoding paths form the parent candidate decoding paths for the next decoding level);

when the leaf nodes of the code tree are reached, selects one of the candidate decoding paths in the list of candidate decoding paths (the selected candidate decoding paths being for example the highest-metric decoding path, as detailed below), and assigns the estimate $\hat{u}_i$ of the input bits $u_i$ to it (which allows obtaining the corresponding information bits).

A processing loop of the standard successive cancellation list decoding can for example be found in Kai Chen, Bin Li, Hui Shen, Jie Jin, and David Tse, "*Reduce the Complexity of List Decoding of Polar Codes by Tree-Pruning*", Fellow, IEEE, which is incorporated herein by reference.

FIG. 3D shows an exemplary successive cancellation list decoding scheme (right decoding path) as compared to the successive cancellation decoding scheme of FIG. 3C (left decoding path)—in FIG. 3D the number in correspondence of each node, the numbered circles, the black circles and the grey circles have same meaning as that of FIG. 3C.

As visible in the figure, based on successive cancellation list decoding, the most probable decoding path (i.e., 1000) is identified.

In successive cancellation list decoding, the L most likely children decoding paths out of 2L children of L different parent decoding paths have to be chosen or selected; in order to achieve it, LLRs $L_n^{(i)}[l]$ alone are not sufficient, therefore the following metric (hereinafter, path metric) $PM_l^{(i)}$ is determined for each candidate decoding path (i.e., at each decoding level, for each duplicated candidate decoding path):

$$PM_l^{(i)} \triangleq \sum_{j=0}^{i} \ln\left(1 + e^{-(1-2\hat{u}_j[l]) \cdot L_n^{(j)}[l]}\right)$$

and updated successively at each decoding level by setting:

$$PM_l^{(i)} \leftarrow \begin{cases} PM_l^{(i-1)} + |L_n^{(i)}[l]|, & \text{if } \hat{u}_i[l] \neq \frac{1}{2}(1 - \text{sign}(L_n^{(i)}[l])) \\ PM_l^{(i-1)}, & \text{otherwise} \end{cases}$$

The amount $\frac{1}{2}(1-\text{sign}(L_n^{(i)}[l]))$ is the path direction that the LLR (given the past path direction $\hat{u}_0^{i-1}[l]$) suggests. The above equation shows that if at the i-th decoding level the l-th decoding path does not follow the path direction suggested by the LLR $L_n^{(i)}[l]$, it will be penalized by an amount $\approx |L_n^{(i)}[l]|$. As soon as a frozen bit is encountered, the path metric $PM_l^{(i)}$ is updated based on the likelihood of that frozen bit, given the past path direction and the a-priori known value of that frozen bit: if the value of that frozen bit is not consistent with the path direction suggested by the LLR (which is an indication of a previous erroneous selection of the candidate decoding paths), the decoding path can be penalized by a considerable amount, while keeping some other candidate decoding paths being not penalized.

The Applicant has understood that the performance of the conventional successive cancellation list decoding increases as the list size increases, but that a list size increase adds hardware and software complexity to the SSD device.

According to the principles of the present invention, at each decoding level of the successive cancellation list decoding, a reliability of the unfrozen bits included in the duplicated candidate decoding paths is determined (e.g. by associating a LLR value with each one of the unfrozen bits), and a maximum list size indicative of an allowed maximum number of candidate decoding paths that can be contained in the list of candidate decoding paths is determined according to a number of unfrozen bits included in the candidate decoding paths whose reliability is below a predetermined threshold reliability (hereinafter referred to a crucial bits). In other words, the maximum list size is dynamically changed (or is adapted to be changed) at each decoding level according to the number of crucial bits, whereby the pruning operation performed by the successive cancellation list decoding is based on the maximum list size (i.e., the pruning operation is such that, at each decoding level, the number of non-pruned duplicated candidate decoding paths does not exceed the maximum list size determined for that decoding level).

For the purposes of the present disclosure, the crucial bits may comprise at least on among unfrozen bits associated with one or more rows of the generator matrix $G_N$ having minimum weight or weight below a predetermined threshold weight (e.g., with a low number of "1" in the generator matrix $G_N$), unfrozen bits associated with channels having low average LLR value (or, more in general, having an LLR value below a predetermined threshold average LLR value), which are the most uncertain ones, and unfrozen bits associated with channels having high error probability (or, more in general, having error probability above a predetermined threshold probability error).

According to an embodiment of the present invention, at each decoding level the maximum list size is increased by a first predetermined amount if the number of crucial bits has increased over time (preferably between the previous decoding level and the current decoding level) by at least a first predetermined number, or the maximum list size is decreased by a second predetermined amount (e.g., equal to or different from the first predetermined amount) if the number of crucial bits has decreased over time (e.g., between the previous decoding level and the current decoding level) by at least a second predetermined number (e.g., equal to or different from the first predetermined number). The connection between the number of crucial bits and the increase/decrease of the maximum list size will be detailed below when discussing the relationship, experimentally ascertained by the Applicant, between a metric range and LLRs.

The first and second predetermined amounts, and the first and second predetermined numbers are advantageously determined (and preferably periodically updated) by the control unit 325 according to parameter(s) of the SSD device 300, with such parameter(s) that may comprise one or more among a code rate of the polar encoded bits (i.e., the ratio between the information bits to the encoding unit 345 and the total number of bits created by the encoding unit 345, where the total number of bits created by the encoding unit 345 includes the information bits and the frozen bits), and a storage availability of the SSD device 300.

In order to determine variations in the number of the crucial bits, any suitable variable associated with the SSD device 300 and/or operations thereof may be used. Just as an example, the Applicant has experimentally ascertained that variations in the number of crucial bits may be determined according to variations of the path metric $PM_l^{(i)}$. According to a particularly preferred embodiment of the present invention, variations in the number of crucial bits are determined (and the maximum list size correspondingly changed) according to a metric range $MR_i$ indicative of a difference between a highest-metric candidate decoding path $PM_H^{(i)}$ of the list of candidate decoding paths and a lowest-metric candidate decoding path $PM_L^{(i)}$ of the list of candidate decoding paths (in the exemplary considered embodiment in which the path metric $PM_l^{(i)}$ is determined for each duplicated candidate decoding path, $PM_H^{(i)}$ and $PM_L^{(i)}$ denote the highest-metric and lowest metric duplicated candidate decoding paths, respectively):

$$MR_i = PM_H^{(i)} - PM_L^{(i)}$$

In the preferred embodiment herein considered, the maximum list size is dynamically varied according to a variation of the metric range $MR_i$, the metric range $MR_i$ being for example continuously monitored by the control unit 325 (with the control unit 325 that, preferably, is also in charge of computing the maximum list size and communicating it to the decoding unit 350).

The maximum list size may for example be varied (i.e., increased or decreased) by one or more predetermined amounts when the metric range $MR_i$ reaches one or more predetermined metric ranges. By way of example only, the maximum list size may be increased by a first predetermined list size amount when the metric range $MR_i$ has decreased, e.g. between the previous decoding level and the current decoding level, by at least a first predetermined metric range amount, or the maximum list size may be decreased by a second predetermined list size amount (e.g., equal to or different from the first predetermined list size amount) when the metric range $MR_i$ has increased, e.g. between the previous decoding level and the current decoding level, by at least a second predetermined metric range amount.

Similarly to the above, the first and second predetermined list size amounts, and the first and second predetermined metric range amounts, are advantageously determined (and preferably periodically updated) by the control unit 325 according to the parameter(s) of the SSD device 300, with such parameter(s) that may comprise one or more among the code rate of the polar encoded bits and the storage availability of the SSD device 300.

As mentioned above, the variation of the maximum list size according to the variation metric range $MR_i$ is based on a relationship, experimentally ascertained by the Applicant, between metric range $MR_i$ and LLRs. Such a relationship is shown in FIG. 3E. In this figure, the small, vertical bars represent crucial bits: black circles in the picture show a drop in the metric range $MR_i$, which are in correspondence of the crucial bits. When instead a rapid increase in the metric range $MR_i$ takes place, no crucial bit is provided in its correspondence (the absence of vertical bars means a sequence of frozen bits): in this case the metric range $MR_i$ increases because the LLR value is certain.

In FIG. 3E, some long flat values of the metric range $MR_i$ are also visible, which correspond to non-crucial unfrozen bits (represented by long vertical bars), i.e. unfrozen bits included in the candidate decoding paths having a reliability above the predetermined threshold reliability. Successive cancellation list decoding fails mainly because the position of the correct decoding path in the list of candidate decoding path is not the first one or has been pruned by the list size.

The correct decoding path that loses its first position in the list of candidate decoding paths due to the added penalty term can gain back its first position as the most likely candidate decoding path after a sequence of unfrozen bits: for this reason, avoiding the pruning of such a decoding path is very important, and this is achieved thanks to the present invention of dynamically varying the maximum list size at each decoding level. FIG. 3F shows this scenario: the penalty increase occurs mainly at the beginning (first decoding levels) where a relevant number of crucial bits is provided and the metric range $MR_i$ decreases. In this case the correct decoding path is not in the first position in the list and, if the list size is fixed to 16 (L=16), it can be pruned thereby causing a decoding failure (curve "a" in FIG. 3F). Curve "b" instead shows that the correct decoding path can gain back its position after some penalties and, if the maximum list size is big enough (especially at the first decoding level(s)) successful decoding takes place.

As mentioned above, one of the parameters of the SSD device 300 according to which the control unit 325 determines the first and second predetermined amounts and the first and second predetermined metric ranges is the code rate of the polar encoded bits: this is consistent with the relationship ascertained by the Applicant, in that the weight of the crucial bits increases as code rate increases.

The present invention allows increasing the performances of the SSD device 300, in that the maximum list size may be increased (even significantly) where required, without increasing memory requirement—in that the maximum list size is advantageously decreased when strong unfrozen bits (i.e., non-crucial unfrozen bits) are involved.

Naturally, in order to satisfy local and specific requirements, a person skilled in the art may apply to the present invention as described above many logical and/or physical modifications and alterations. More specifically, although the present invention has been described with a certain degree of particularity with reference to preferred embodiments thereof, it should be understood that various omissions, substitutions and changes in the form and details as well as other embodiments are possible. In particular, different embodiments of the invention may even be practiced without the specific details set forth in the preceding description for providing a more thorough understanding thereof; on the contrary, well-known features may have been omitted or simplified in order not to encumber the description with unnecessary details. Moreover, it is expressly intended that specific elements and/or method steps described in connection with any disclosed embodiment of the invention may be incorporated in any other embodiment.

What is claimed is:

1. A method for operating a controller of a solid state storage device, the method comprising:
    encoding information and frozen bits with a polar code thereby obtaining polar encoded bits;
    storing said polar encoded bits in memory cells of the solid state storage device,
    reading the polar encoded bits stored in the memory cells of the solid state storage device, the read polar encoded bits including the frozen bits and unfrozen bits indicative of said information bits,
    performing a successive cancellation list (SCL) decoding of the read polar encoded bits, said performing a SCL decoding comprising:
        providing a list of candidate decoding paths;
        duplicating the candidate decoding paths included in the list of candidate decoding paths thereby obtaining duplicated candidate decoding paths;
        determining a reliability of the unfrozen bits included in the duplicated candidate decoding paths;
        determining a maximum list size indicative of an allowed maximum number of candidate decoding paths that can be contained in the list of candidate decoding paths based on a number of unfrozen bits included in the duplicated candidate decoding paths having a reliability below a predetermined threshold reliability;
        pruning at least one duplicated candidate decoding path among the duplicated candidate decoding paths according to the determined maximum list size and updating the list of candidate decoding paths by including in the list of candidate decoding paths a number of non-pruned duplicated candidate decoding paths not higher than the maximum list size, and
        selecting a decoding path from the list of candidate decoding paths thereby obtaining the information bits.

2. The method of claim 1, wherein
    said duplicating the candidate decoding paths included in the list of candidate decoding paths,
    said determining a reliability of the unfrozen bits included in the duplicated candidate decoding paths,
    said determining a maximum list size, and
    said pruning at least one duplicated candidate decoding path among the duplicated candidate decoding paths and said updating the list of candidate decoding paths
    are iterated before said selecting a decoding path from the list of candidate decoding paths.

3. The method of claim 2, wherein said determining a maximum list size comprises, at each current iteration:
    increasing the maximum list size by a first predetermined amount if the number of unfrozen bits whose reliability is below the predetermined reliability threshold has increased, between a previous iteration before the current iteration and the current iteration, by at least a first predetermined number, or
    decreasing the maximum list size by a second predetermined amount if the number of unfrozen bits whose reliability is below the predetermined reliability threshold has decreased, between the previous iteration and the current iteration, by at least a second predetermined number.

4. The method of claim 3, wherein at least one between the first and second predetermined amounts and the first and second predetermined numbers are determined according to at least one parameter of the solid state storage device.

5. The method of claim 4, wherein said at least one parameter of the solid state storage device comprises at least one among a code rate of the polar encoded bits and a storage availability of the solid state storage device.

6. The method of claim 2, wherein said determining a reliability of the unfrozen bits included in the duplicated candidate decoding paths comprises:
   determining, for each duplicated candidate decoding path, a metric indicative of a reliability of said duplicated candidate decoding path according to the reliability of the unfrozen bits included in said duplicated candidate decoding path, and
   determining a metric range indicative of a difference between a highest-metric duplicated candidate decoding path and a lowest-metric duplicated candidate decoding path,
wherein said determining a maximum list size comprises, at each iteration, varying the maximum list size according to a change in the metric range.

7. The method of claim 6, wherein said varying the maximum list size according to a change in the metric range comprises:
   increasing the maximum list size by a first predetermined list size amount if the metric range has decreased, between a previous iteration before the current iteration and the current iteration, by at least a first predetermined metric range amount, or
   decreasing the maximum list size by a second predetermined list size amount if the metric range has increased, between the previous iteration and the current iteration, by at least a second predetermined metric range amount.

8. The method of claim 7, wherein at least one between the first and second predetermined list size amounts and the first and second predetermined metric ranges are determined according to at least one parameter of the solid state storage device.

9. The method of claim 8, wherein said at least one parameter of the solid state storage device comprises at least one among a code rate of the polar encoded bits and a storage availability of the solid state storage device.

10. The method of claim 1, wherein said determining a reliability of the unfrozen bits comprises associating a Log Likelihood Ratio (LLR) value with each one of the unfrozen bits.

11. The method of claim 1, wherein the unfrozen bits having a reliability below a predetermined reliability threshold comprise at least one among:
   unfrozen bits associated with one or more rows of a generator matrix having weight below a predetermined threshold weight, the generator matrix generating the polar encoded bits;
   unfrozen bits associated with channels having average Log Likelihood Ratio (LLR) value below a predetermined threshold average LLR value, and
   unfrozen bits associated with channels having error probability above a predetermined threshold error probability.

12. A controller for a solid state storage device, the controller comprising:
   a polar encoder for encoding information and frozen bits with a polar code, thereby obtaining polar encoded bits to be stored in memory cells of the solid state storage device,
   a successive cancellation list (SCL) decoder for performing a successive cancellation list (SCL) decoding of read polar encoded bits being read from the memory cells of the solid state storage device, the read polar encoded bits including the frozen bits and unfrozen bits indicative of said information bits, wherein the SCL decoder is configured to perform:
      providing a list of candidate decoding paths;
      duplicating the candidate decoding paths included in the list of candidate decoding paths thereby obtaining duplicated candidate decoding paths;
      determining a reliability of the unfrozen bits included in the duplicated candidate decoding paths;
      determining a maximum list size indicative of an allowed maximum number of candidate decoding paths that can be contained in the list of candidate decoding paths based on a number of unfrozen bits included in the duplicated candidate decoding paths having a reliability below a predetermined threshold reliability;
      pruning at least one duplicated candidate decoding path among the duplicated candidate decoding paths according to the determined maximum list size and updating the list of candidate decoding paths by including in the list of candidate decoding paths a number of non-pruned duplicated candidate decoding paths not higher than the maximum list size, and
      selecting a decoding path from the list of candidate decoding paths thereby obtaining the information bits.

13. The controller of claim 12, wherein the SCL decoder configured to iterate
   said duplicating the candidate decoding paths included in the list of candidate decoding paths,
   said determining a reliability of the unfrozen bits included in the duplicated candidate decoding paths,
   said determining a maximum list size, and
   said pruning at least one duplicated candidate decoding path among the duplicated candidate decoding paths and said updating the list of candidate decoding paths,
   before said selecting a decoding path from the list of candidate decoding paths.

14. The controller of claim 13, wherein the SCL decoder is configured to:
   determine, for each duplicated candidate decoding path, a metric indicative of a reliability of said duplicated candidate decoding path according to the reliability of the unfrozen bits included in said duplicated candidate decoding path, and
   determine a metric range indicative of a difference between a highest-metric duplicated candidate decoding path and a lowest-metric duplicated candidate decoding path,
the SCL decoder being further configured to vary, at each iteration, the maximum list size according to a change in the metric range.

15. The controller of claim 14, wherein the SCL decoder is configured to vary the maximum list size by:
   increasing the maximum list size by a first predetermined list size amount if the metric range has decreased, between a previous iteration before the current iteration and the current iteration, by at least a first predetermined metric range amount, or decreasing the maximum list size by a second predetermined list size amount if the metric range has increased, between the previous iteration and the current iteration, by at least a second predetermined metric range amount.

16. The controller of claim 15, wherein at least one between the first and second predetermined list size amounts and the first and second predetermined metric ranges are determined according to at least one parameter of the solid state storage device.

17. The controller of claim 16, wherein said at least one parameter of the solid state storage device comprises at least one among a code rate of the polar encoded bits and a storage availability of the solid state storage device.

18. The controller of claim 12, wherein the SCL decoder is configured to, at each current iteration:
   increase the maximum list size by a first predetermined amount if the number of unfrozen bits whose reliability is below the predetermined reliability threshold has increased, between a previous iteration before the current iteration and the current iteration, by at least a first predetermined number, or
   decrease the maximum list size by a second predetermined amount if the number of unfrozen bits whose reliability is below the predetermined reliability threshold has decreased, between the previous iteration and the current iteration, by at least a second predetermined number.

19. The controller of claim 18, wherein at least one between the first and second predetermined amounts and the first and second predetermined numbers are determined according to at least one parameter of the solid state storage device.

20. The controller of claim 19, wherein said at least one parameter of the solid state storage device comprises at least one among a code rate of the polar encoded bits and a storage availability of the solid state storage device.

21. The controller of claim 12, wherein the SCL decoder is configured to determine a reliability of the unfrozen bits by associating a Log Likehood Ratio (LLR) value with each one of the unfrozen bits.

22. The controller of claim 12, wherein the unfrozen bits having a reliability below a predetermined reliability threshold comprise at least one among:
   unfrozen bits associated with one or more rows of a generator matrix having weight below a predetermined threshold weight, the generator matrix generating the polar encoded bits;
   unfrozen bits associated with channels having average Log Likehood Ratio (LLR) value below a predetermined threshold average LLR value, and
   unfrozen bits associated with channels having error probability above a predetermined threshold error probability.

23. A solid state storage device comprising:
   a polar encoder for encoding information and frozen bits with a polar code, thereby obtaining polar encoded bits,
   memory cells for storing the polar encoded bits,
   reading circuitry for reading the polar encoded bits from the memory cells,
   a successive cancellation list (SCL) decoder for performing a successive cancellation list (SCL) decoding of the read polar encoded bits, the read polar encoded bits including the frozen bits and unfrozen bits indicative of said information bits, wherein the SCL decoder is configured to perform:
      providing a list of candidate decoding paths;
      duplicating the candidate decoding paths included in the list of candidate decoding paths thereby obtaining duplicated candidate decoding paths;
      determining a reliability of the unfrozen bits included in the duplicated candidate decoding paths;
      determining a maximum list size indicative of an allowed maximum number of candidate decoding paths that can be contained in the list of candidate decoding paths based on a number of unfrozen bits included in the duplicated candidate decoding paths having a reliability below a predetermined threshold reliability;
      pruning at least one duplicated candidate decoding path among the duplicated candidate decoding paths according to the determined maximum list size and updating the list of candidate decoding paths by including in the list of candidate decoding paths a number of non-pruned duplicated candidate decoding paths not higher than the maximum list size, and
      selecting a decoding path from the list of candidate decoding paths thereby obtaining the information bits.

24. The solid state storage device of claim 23, wherein the SCL decoder is configured to iterate
   said duplicating the candidate decoding paths included in the list of candidate decoding paths,
   said determining a reliability of the unfrozen bits included in the duplicated candidate decoding paths,
   said determining a maximum list size, and
   said pruning at least one duplicated candidate decoding path among the duplicated candidate decoding paths and said updating the list of candidate decoding paths,
   before said selecting a decoding path from the list of candidate decoding paths.

25. The solid state storage device of claim 24, wherein the SCL decoder is configured to:
   determine, for each duplicated candidate decoding path, a metric indicative of a reliability of said duplicated candidate decoding path according to the reliability of the unfrozen bits included in said duplicated candidate decoding path, and
   determine a metric range indicative of a difference between a highest-metric duplicated candidate decoding path and a lowest-metric duplicated candidate decoding path,
the SCL decoder being further configured to vary, at each iteration, the maximum list size according to a change in the metric range.

26. The solid state storage device of claim 25, wherein the SCL decoder is configured to vary the maximum list size by:
   increasing the maximum list size by a first predetermined list size amount if the metric range has decreased, between a previous iteration before the current iteration and the current iteration, by at least a first predetermined metric range amount, or
   decreasing the maximum list size by a second predetermined list size amount if the metric range has increased, between the previous iteration and the current iteration, by at least a second predetermined metric range amount.

27. The solid state storage device of claim 26, wherein at least one between the first and second predetermined list size amounts and the first and second predetermined metric ranges are determined according to at least one parameter of the solid state storage device.

28. The solid state storage device of claim 27, wherein said at least one parameter of the solid state storage device comprises at least one among a code rate of the polar encoded bits and a storage availability of the solid state storage device.

29. The solid state storage device of claim 23, wherein the SCL decoder is configured to, at each current iteration:
   increase the maximum list size by a first predetermined amount if the number of unfrozen bits whose reliability is below the predetermined reliability threshold has increased, between a previous iteration before the current iteration and the current iteration, by at least a first predetermined number, or
   decrease the maximum list size by a second predetermined amount if the number of unfrozen bits whose reliability is below the predetermined reliability threshold has decreased, between the previous iteration and the current iteration, by at least a second predetermined number.

30. The solid state storage device of claim 29, wherein at least one between the first and second predetermined amounts and the first and second predetermined numbers are determined according to at least one parameter of the solid state storage device.

31. The solid state storage device of claim 30, wherein said at least one parameter of the solid state storage device comprises at least one among a code rate of the polar encoded bits and a storage availability of the solid state storage device.

32. The solid state storage device of claim 23, wherein the SCL decoder is configured to determine a reliability of the unfrozen bits by associating a Log Likehood Ratio (LLR) value with each one of the unfrozen bits.

33. The solid state storage device of claim 23, wherein the unfrozen bits having a reliability below a predetermined reliability threshold comprise at least one among:
   unfrozen bits associated with one or more rows of a generator matrix having weight below a predetermined threshold weight, the generator matrix generating the polar encoded bits;
   unfrozen bits associated with channels having average Log Likehood Ratio (LLR) value below a predetermined threshold average LLR value, and
   unfrozen bits associated with channels having error probability above a predetermined threshold error probability.

34. The solid state storage device of claim 23, wherein the memory cells are flash memory cells.

35. The solid state storage device of claim 23, wherein said memory cells are NAND flash memory cells.

* * * * *